(12) United States Patent
Uehara et al.

(10) Patent No.: US 6,712,081 B1
(45) Date of Patent: Mar. 30, 2004

(54) PRESSURE PROCESSING DEVICE

(75) Inventors: Katsuhiro Uehara, Takasago (JP); Yoshihiko Sakashita, Takasago (JP); Takeshi Kanda, Takasago (JP); Takeo Nishimoto, Takasago (JP)

(73) Assignee: Kobe Steel, Ltd., Kobe (JP)

( * ) Notice: Subject to any disclaimer, the term of this patent is extended or adjusted under 35 U.S.C. 154(b) by 124 days.

(21) Appl. No.: 09/650,812

(22) Filed: Aug. 30, 2000

(30) Foreign Application Priority Data

Aug. 31, 1999 (JP) .......................................... 11-245692
Sep. 29, 1999 (JP) .......................................... 11-276565
Mar. 30, 2000 (JP) ...................................... 2000-095431

(51) Int. Cl.$^7$ ............................................... B08B 3/00
(52) U.S. Cl. ....................... 134/105; 134/110; 134/155; 134/186; 134/902
(58) Field of Search ............................... 134/105, 107, 134/110, 155, 186, 200, 902; 34/85, 337, 343, 393, 467

(56) References Cited

U.S. PATENT DOCUMENTS

| | | | | |
|---|---|---|---|---|
| 4,756,680 A | * | 7/1988 | Ishii | .............................. 425/78 |
| 4,983,112 A | * | 1/1991 | Uehara et al. | .................. 419/49 |
| 5,355,901 A | * | 10/1994 | Mielnik et al. | .............. 134/105 |
| 5,698,029 A | * | 12/1997 | Fujikawa et al. | ............ 117/200 |
| 5,798,126 A | | 8/1998 | Fujikawa et al. | .............. 425/78 |
| 6,068,002 A | * | 5/2000 | Kamikawa et al. | ....... 134/102.3 |
| 6,306,564 B1 | * | 10/2001 | Mullee | ......................... 134/1.3 |
| 6,328,560 B1 | * | 12/2001 | Fujikawa et al. | ............ 432/205 |
| 6,334,226 B1 | * | 1/2002 | Tokunaga et al. | ............... 4/675 |
| 6,357,142 B1 | * | 3/2002 | Bergman et al. | .............. 134/1.3 |

FOREIGN PATENT DOCUMENTS

| | | |
|---|---|---|
| JP | 4-240389 | 8/1992 |
| JP | 9-303557 | 11/1997 |

* cited by examiner

*Primary Examiner*—Randy Gulakowski
*Assistant Examiner*—Joseph Perrin
(74) *Attorney, Agent, or Firm*—Oblon, Spivak, McClelland, Maier & Neustadt, P.C.

(57) ABSTRACT

A pressure processing device including a vessel having a body and an opening/closing member. A seal member is provided on a joining surface between the body and the opening/closing member, and a non-sliding joining surface is provided which is not slidably moved when the member is opened and closed. A device is provided including a diaphragm for housing an object to be processed, and a fluid introducing passage to the vessel provided so that a greater part of a fluid flowing into the vessel flows into the diaphragm. The diaphragm can be formed of heat insulating material, and a filter can be provided for removing particles installed on the side of the diaphragm into which a fluid flows. A plate having a labyrinth construction can be provided for trapping particles by parts on a surface thereof. A pressure processing device in which an object may be washed is also provided.

19 Claims, 22 Drawing Sheets

→ FLOW OF CLEAN FLUID
➡ FLOW OF FLUID CONTAINING PARTICLES

PRESSURE PROCESSING DEVICE

BACKGROUND OF THE INVENTION

1. Field of the Invention

The present invention relates to a device for placing an object to be processed in contact with a supercritical fluid, a subcritical fluid or a liquefied gas within a pressure vessel to process the same.

2. Discussion of the Background

A hot isotropic pressure press processing (hereinafter, referred to as "HIP") is the processing which is carried out, when an inconvenience such as pores occurs within a cast article, a sintered article or the like, for the purpose of removing the pores, with respect to the aforesaid articles, and in which the object to be processed is put into a cylindrical pressure vessel interior of which forms a processing chamber, and a pressure gas atmosphere in excess of hundreds of atmospheric pressure in inactive gas such as argon is exposed thereto.

A supercritical gas extraction method applies a specific characteristic of a substantially middle state between gas and liquid having a state in excess of a critical point (a critical temperature, a critical pressure) peculiar to a material (a density is dose to liquid, and a diffusion coefficient and a viscosity are close to gas). There are characteristics that since extraction can be made under the gentle temperature condition, deterioration and decomposition of unstable objects to be processed can be avoided, that there is no possible residue of solvent in the objects to be processed, and that the solvent has a low viscosity and high diffusion properties, and is high in extraction separation speed.

The critical point of a carbon dioxide used as the solvent is pressure of 73 atm, and a temperature of 31° C. Therefore, the device constituting the supercritical gas extraction device has to withstand the use at high pressure.

On the other hand, also in the liquefied gas extraction, the liquefied carbon dioxide is, for example, 60 atm at a room temperature of 20° C, and the device need likewise be withstand the use at high pressure.

In such a pressure processing device, particularly where a specimen is a solid, it is necessary to open and close a lid of an extraction tank in taking in and out of the specimen to an extraction tank in which a supercritical gas or a liquefied gas comes in contact with the specimen.

The simplification of the closing operation of the lid, and the positive closing properties under the high pressure at the extraction operation (at the pressure processing) are required.

Recently, these pressure processing devices have various uses, and are being applied also to the process for manufacturing semiconductors and electronic parts. That is, typical applied examples include the way of pressure burying for eliminating pores formed in a metal wiring in the HIP processing, and the washing and drying of minute structures of semiconductors and electronic parts as shown in Japanese Patent Application Laid-Open No. Hei 9-232271 in the supercritical processing.

In these uses, particularly a device which is free from occurrence of dust or the like is necessary. For example, in the processing of semiconductors such as a silicon wafer, in a process, the adhesion of large dusts less than 1 micron called particles to an object to be processed impairs soundness of an electronic circuit pattern formed on the wafer surface, thus requiring a device which realizes particle-free in which is free from or hard to produce such dusts as described.

In the pressure processing devices so far proposed, a seal construction of a lid closing part as disclosed in Japanese Patent Application Laid-Open Nos. Hei 3-135402 and 8-141307 Publications has been used for simplifying the closing operation of a lid.

Japanese Patent Application Laid-Open No. Hei 3-135402 discloses a device characterized in that an inner tube of a pressure vessel is inserted into an outer tube of a pressure vessel, a closing means for both the tubes while enabling insertion is provided, and either inner tube or outer tube is slidably moved to take in and out material from an opening part provided in the circumferential part of the inner tube.

Further, Japanese Patent Application Laid-Open No. Hei 8-141307 discloses a device characterized in that filters are secured integrally to an upper lid and a lower lid, respectively, of a pressure vessel.

However, in these devices, a so-called "shaft seal construction" in which an O-ring or the like is mounted on the cylindrical surface which is positive in high pressure seal has been used. However, in the shaft seal construction, since a guide function for registration of shafts resulting from the closing is imparted to a fixing part in which an O-ring is mounted when the lid is opened and closed, worn refuse of the O-ring caused by the sliding movement of the O-ring forms dust.

SUMMARY OF THE INVENTION

The present invention has been accomplished in view of the problem noted above, and has its object to provide a pressure processing device which is useful as compared with the conventional devices.

One of specific objects is to provide a pressure processing device capable of carrying out processing which is free from particles.

In the semiconductor industry of an integrating circuit or the like, particularly, the productivity is very important, but in the conventional techniques, the temperature control accuracy and the temperature control reactiveness which are essential to the enhancement of the productivity were difficult to enhance. Accordingly, in the conventional pressure processing device such as a supercritical extraction tank for placing an object to be processed in contact with supercritical gas, a subcritical gas or a liquefied gas to process the same, no consideration has been made to the point of the particle-free, posing a problem that the conventional device fails to deal with the case where processing in the very clean atmosphere such as an integrating circuit is necessary. It is therefore an object of the present invention to provide a pressure processing device capable of enhancing the temperature control accuracy and the temperature control reactiveness which are essential to the enhancement of the productivity.

Further, since the aforementioned shaft seal construction employs the construction to fit the lids, the moving distance when a vessel is opened and closed is long, and it takes time. It is therefore a further object of the present invention to provide a pressure processing device having a lid construction having a lid construction which enables take-in and take-out by a simple method, without employing the fitting construction, and which has positive closing properties and free from occurrence of dust resulting from the closing of the lid.

Incidentally, the conventional extraction tank is generally of the flange type of an autoclave, which requires fastening using many bolts, thus being not efficient. Accordingly, there has been desired an extraction tank.

Devices for carrying out the closing operation of a pressure vessel relatively simply without requiring fastening using a number of bolts proposed so far include, for example, Japanese Patent Application Laid-Open No. Sho 64-7905, Japanese Patent Application Laid-Open No. Hei 3-135402, Japanese Utility Model Publication No. Sho 63-1182, and the like.

Also in both the Japanese Patent Application Laid-Open No. Sho 64-7905 and Japanese Patent Application Laid-Open No. Hei 3-135402, plugs (corresponding to lids) are detachably fitted into upper and lower parts of the pressure vessel, and a crossing pin was made detachable in the state that a through-hole bored in a diametrical direction of the plug and a through-hole bored in a diametrical direction of the pressure vessel are registered in holes.

Therefore, the axial force exerting in the axial direction of the vessel during the pressure processing is borne by the pressure vessel through the crossing pin, and not only the shearing force exerts on the crossing pin but also the bending force or the like exerts thereon, thus posing a problem in positiveness, and posing a problem also in durability.

Further, when the crossing pin is mounted and removed, the detaching resistance becomes excessive unless the registered continuous through-hole is provided, thus posing a problem that the mounting and removing the crossing pin is difficult (unreliable).

On the other hand, in Japanese Utility Model Publication No. Sho 63-1182, the axial force during the HIP processing can be borne by the press frame so that the problems encountered in Japanese Patent Application Laid-Open No. Sho 64-7905 and Japanese Patent Application Laid-Open No. Hei 3-135402 can be overcome, whereas it is necessary to turn or laterally move the press frame, thus posing a problem that an extra space required for moving the press frame is necessary.

It is a further object of the present invention to provide a pressure processing device which enables the take-in and out of an object to be processed from a vessel by a simple method, is positive in closing properties and axial force bearing properties, and is compact in space required for installation.

Further, a pressure processing device as a washing device for washing parts having a superminute construction such as a semiconductor, a micro machine or the like is disclosed in Japanese Patent Application Laid-Open No. Hei 9-232271.

However, in case of the conventional supercritical washing device, particularly a device for washing a semiconductor wafer, wafers can be processed merely one by one for the high pressure vessel. Since it is of a so-called sheet type, there is a problem that the productivity is poor.

It is therefore another object of the present invention to provide a pressure processing device as a washing device capable of providing processing of high productivity.

For achieving the aforementioned objects, the present invention has employed the following technical means. That is, the pressure processing device according to the present invention is to process an object to be processed by a pressure vessel, said pressure vessel comprising a vessel body and an opening and closing member for closeably closing an opening formed in said vessel body, a seal member being provided on the joining surface in which said vessel body comes in contact with the opening and closing member, the non-sliding joining surface which is not slidably moved when the opening and closing member is moved to be opened and closed.

Since the seal member is provided on the non-sliding joining surface, when the opening is closed or opened by the opening and closing member, the seal member is not slidably moved, thus being able to prevent dust from occurrence.

More specifically, there is provided a pressure processing device for placing an object to be processed in contact with a supercritical fluid, a subcritical fluid or a liquefied gas to process the same within a pressure vessel, said pressure vessel comprising a cylinder one end of which is closed and a lid for closing an opening in the other end of the cylinder, said device further comprising a pressing means for pressing the lid in an axial direction of said cylinder with respect to said cylinder, and a seal member between an open end of the cylinder and the opposed end of the lid opposite to the open end of the cylinder.

Another technical means of the present invention is provided with a diaphragm so as to form an airtight space within the pressure vessel, and a heating means is provided within the airtight space formed by said diaphragm.

In still another technical means of the present invention, a fluid introducing passage to the pressure vessel and a fluid discharging passage are individually provided so that they communicate inside and outside, respectively, of said diaphragm.

In another technical means of the present invention, a filter for supplementing superminute particles is provided halfway of the fluid introducing passage to the pressure vessel.

In another technical means of the present invention, a heat insulating layer is provided internally of the pressure vessel so as to airtightly isolate the inside from the outside of the heat insulating layer, a communicating passage for communicating the inside and outside of the heat insulating layer is provided, and a filter for supplementing superminute particles is provided halfway of the communicating passage.

According to still another technical means of the present invention, there is provided a pressure processing device for placing an object to be processed in contact with a supercritical fluid, a subcritical fluid or a liquefied gas to process the same within a pressure vessel, wherein a diaphragm for housing an object to be processed is provided within the pressure vessel, and a fluid introducing passage to the pressure vessel is provided so that the greater part of fluid flowing into the pressure vessel may flow into the diaphragm.

According to another technical means of the present invention, a filter for supplementing superminute particles is provided halfway of the fluid introducing passage to the pressure vessel.

According to still another technical means of the present invention, there is provided a pressure processing device for placing an object to be processed in contact with a supercritical fluid, a subcritical fluid or a liquefied gas to process the same within a pressure vessel, wherein a diaphragm formed of a heat insulating material is provided between an object to be processed and a pressure vessel, and a filter for supplementing superminute particles is provided on the side of said diaphragm into which fluid flows.

According to another technical means of the present invention, said diaphragm is formed of ceramics such as quartz, SiC, $Si_3N_4$, $Al_2O_3$, at least one out of metals of low heat conductivity, or a combination of said materials.

According to another technical means of the present invention, said filter is made of metal.

Further, the pressure processing device according to the present invention is to process an object to be processed by a pressure vessel, said pressure vessel comprising a cylindrical vessel body, and an opening and closing member for closeably closing an opening formed in one end in an axial direction of said cylindrical vessel body by coming into contact with said end, wherein a ring-like groove is provided in a joining surface of said vessel body and said opening and closing member, a ring-like member is detachably fitted in said ring-like groove, a ring-like groove-outer peripheral side seal member is provided, in said ring-like member, on the outer peripheral side of said ring-like groove fitted, a ring-like joining-surface side seal member is provided in a portion opposite to the other joining surface not formed with the ring-like groove, and the diameter of said groove-outer peripheral side seal member is greater than that of the joining-surface side seal member.

According to the constitution as described above, even if a clearance should occur between the cylindrical vessel body and the opening and closing member, the ring-like member could be pressed against the joining surface by pressure within the pressure vessel. Accordingly, the take-in and out for use can be done by a simple method, the closing properties are positive, and no dust caused by opening and closing of the lid raises.

A transmission ring-like member having a process fluid transmission can be held between said ring-like groove and said ring-like member.

Further, the pressure processing device according to the present invention is to process an object to be processed in a processing space within a pressure vessel, said pressure vessel comprising a vessel body and an opening and closing member for closeably closing an opening formed in said vessel body, wherein a seal member is mounted on the joining interface of said vessel body and said opening and closing member, and a plate having a labyrinth construction for trapping particles by the rugged surface is provided on the said processing space side rather than said seal member.

According to the constitution as described above, even if dust is raised by opening and closing of the opening and closing member, the dust is trapped by the plate having a labyrinth construction, thus being able to prevent the dust from raising.

Further, preferably, a fluid communicating passage for discharging the fluid in the processing space through said opening and closing member is formed on the back of the plate having a labyrinth construction. In this case, the dust trapped can be discharged outside the vessel through the fluid communicating passage. Particularly, preferably, pressure processing is carried out while flowing the fluid.

Further, according to the present invention, there is provided a pressure processing device comprising a processing vessel body having at least an opening for taking in and out an object to be processed, a lid for closing and opening said opening of the processing vessel body, and a press frame having a central space therein, in which upper and lower ends on said processing vessel body side are detachably engaged with upper and lower holding parts in aid central space, and the axial force exerting in the axial direction of the vessel is received by the press frame, characterized in that a pressure receiver for receiving said axial force by the press frame in the opposed part between said lid side and said lower holding part of said press frame is provided movably in a horizontal direction, and a lid elevating means is provided which moves up and down the lid in the axial direction of the vessel in the state that the receiver is isolated from the opposed part to freely dose and open the opening.

By the provision of the constitution as described, the axial force during the pressure processing can be received positively through the upper and lower holding parts; the take-in and out of an object to be processed can be made simply by the elevating operation of the lid elevating means after the pressure receiver has been moved in the horizontal direction and isolated from the opposed part; since the horizontal movement of the pressure receiver is not during the pressure processing, there is present a slight clearance between the lid side, the lower holding part of the press frame and the pressure receiver, which will not be a great resistance to the horizontal movement of the pressure receiver; the closing properties during the pressure processing can be maintained positively; and a smaller space for the horizontal movement of the pressure receiver than that the press frame is turned and laterally moved will suffice.

It is suggested that the press frame be secured to a frame through a rail frame, and the pressure receiver be enabled to be laterally moved on the rail extending on the horizontal surface provide on the rail frame side.

By the provision of the constitution as described, the horizontal movement of the pressure receiver becomes light and positive.

Further, it is suggested that the lid elevating means be positioned on the shaft center of the vessel, and the press frame and the pressure receiver be respectively provided in a pair on the left and right to the shaft center of the vessel.

By the provision of the constitution as described, the vertical movement of the lid is light and positive, and the seal material (such as an O-ring) when the lid is fitted in the opening is less damaged to assure the closing properties during the pressure processing.

Further, in the pressure processing device as a washing device according to the present invention, the following technical means was employed paying attention to the fact that a plurality of objects to be washed may be processed simultaneously for enhancing the productivity.

That is, the pressure processing device according to the present invention is characterized by a device wherein within a washing vessel in which a washing fluid can be flown in and discharged, an object to be washed such as a semiconductor wafer is washed by said washing fluid, wherein a housing vessel for housing a plurality of objects to be washed is provided within said washing vessel, said housing vessel being provided in the plural number with inlets for causing the washing fluid to flow into the housing vessel, and outlets for causing the washing fluid to discharge outside the housing vessel, and opening areas and or opening numbers of said inlets and outlets are different in the direction of placing the objects to be washed so that the quantities of said washing fluid flowing on the surfaces of the objects to be washed are substantially uniform.

According to the aforementioned pressure processing device (washing device), a plurality of objects to be washed can be housed into a high pressure vessel by the housing vessel, and the plurality of objects to be washed can be processed simultaneously.

Here, the flow rate of the washing fluid flown into the washing vessel is not constant in a space within the washing vessel. That is, the flow rate is large near a position in which the washing fluid flows into the washing vessel, while the flow rate is small at a position away therefrom. Sometimes, the flow rate is not even depending on the shape of the space in the washing vessel but a difference occurs depending on the position.

While in the present invention, the inlets and outlets for introducing and discharging the washing fluid into the housing vessel for housing the plurality of objects to be washed are provided, it is noted that the flow rate of the objects to be washed flowing through the inlets and outlets is possibly different every object to be washed. That is, there occurs a difference in the quantity of the washing fluid flowing into the housing vessel from the inlets whereby the objects to be washed are not possibly washed evenly.

Since in the present invention, the opening areas and or opening numbers of said inlets and outlets are different in the direction of placing the objects to be washed so that the quantities of said washing fluid flowing on the surfaces of the objects to be washed are substantially uniform, the washing fluid flows on the surfaces of the objects to be washed substantially evenly to be able to wash the plurality of objects to be washed.

Further, preferably, the inlets and outlets near the position in which the washing fluid flows into the washing vessel are small in the opening area and or opening number, and the inlets and outlets away from the position in which the washing fluid flows into the washing vessel are large in the opening area and or opening number.

As mentioned previously, the flow rate of fluid is large near the position in which the washing fluid flows into the washing vessel, and accordingly, the washing fluid tends to flow from the inlet of the housing vessel. On the other hand, the flow rate of fluid is small away from the position in which the washing fluid flows into the washing vessel, and accordingly, the washing fluid is hard to flow from the inlet of the housing vessel. Taking this into consideration, the opening area and or the opening number are small in the inlets and outlets near the position in which the washing fluid flows into the washing vessel, and the opening area and or the opening number are large in the inlets and outlets away from the position in which the washing fluid flows into the washing vessel whereby the quantities of the washing fluid flowing on the surfaces of the objects to be washed are made even.

Further, preferably, the washing fluid flows from the top and is discharged from the bottom, and a plurality of objects to be washed can be housed in the housing vessel in the vertical direction, and the opening area and or opening number are large in the lower inlets and outlets.

Further, preferably, the washing vessel is internally provided with a guide part for guiding the washing fluid flown in toward the inlet of the housing vessel. Thereby, the washing fluid is supplied into the housing vessel efficiently.

Further, preferably, a unidirectional flowing channel is formed within the washing vessel, in which the washing fluid flown into the washing vessel flows into the housing vessel from the inlet and is discharged outside the housing vessel from the outlet, after which it is discharged outside the washing vessel.

In this case, the washing fluid discharged out of the housing vessel is discharged outside the washing vessel as it is to prevent the contaminated washing fluid for reflowing within the washing vessel.

Further, preferably, a projection for placing and holding an object to be washed is provided in the inner surface of the housing vessel, and a plurality of objects to be washed can be held easily by the projection.

Further, preferably, the housing vessel is constituted from a plurality of divided members divided in the placing direction of an object to w be washed.

In this case, the taking-in and out of the objects to be washed with respect to the housing vessel can be carried out simply.

Further, if it is supposed that the divided members are joined by a hinge, and the housing vessel can be opened and closed by the hinge, the taking-in and out of the objects to be washed with respect to the housing vessel can be carried out more easily by opening and closing the housing vessel through the hinge.

Further, preferably, the washing vessel is provided with a fluid main discharge passage positioned externally of the housing vessel, and a fluid sub-discharge passage positioned internally of the housing vessel.

Not only the fluid main discharge passage but also the fluid sub-discharge passage positioned internally of the housing vessel are provided whereby fine stains (particles) can be prevented from staying in the housing vessel.

Further, preferably, a diaphragm chamber is provided between the washing vessel and the housing vessel. By the provision of the diaphragm chamber, it is possible to prevent fine stains generated from the washing vessel can be prevented from flowing into the housing vessel.

The present invention is characterized, as viewed from the other point, by providing a device wherein within a washing vessel in which a washing fluid can be flown in and discharged, an object to be washed such as a semiconductor wafer is washed by the washing fluid, wherein a housing vessel for housing a plurality of objects to be washed is provide interiorly of the washing vessel, said housing vessel being provided with an inlet for causing a washing fluid to flow into the housing vessel and an outlet for causing the washing fluid to discharge outside the housing vessel, and a first guide passage for guiding the washing fluid flown into the washing vessel to the inlet, and a second guide passage for guiding the washing fluid discharged out of the outlet outside the washing vessel are formed within the washing vessel.

Even by the constitution as described above, a plurality of objects to be washed can be housed into a high pressure vessel by the housing vessel, and a plurality of objects to be washed can be processed simultaneously.

In the construction in which the housing vessel for housing a plurality of objects to be washed is provided, the housing vessel comprising the inlet and the outlet, the first guide passage for guiding the washing fluid flown into the washing vessel to the inlet, and the second guide passage for guiding the washing fluid discharged out of the outlet outside the washing vessel are formed within the washing vessel, whereby the washing fluid discharged out of the outlet and stained is prevented from reflowing within the washing vessel.

More specifically, preferably, a diaphragm chamber is provided between the washing vessel and the housing vessel, the diaphragm chamber being partitioned into a space serving as the first guide passage and a space serving as the second guide passage.

In this case, the first guide passage and the second guide passage can be constituted by the simple constitution, and the fine stains of the washing vessel are prevented from flowing into the housing vessel by the diaphragm chamber.

DETAILED DESCRIPTION OF THE INVENTION

The embodiments of the present invention will be described hereinafter with reference to the drawings.

Figure 1:
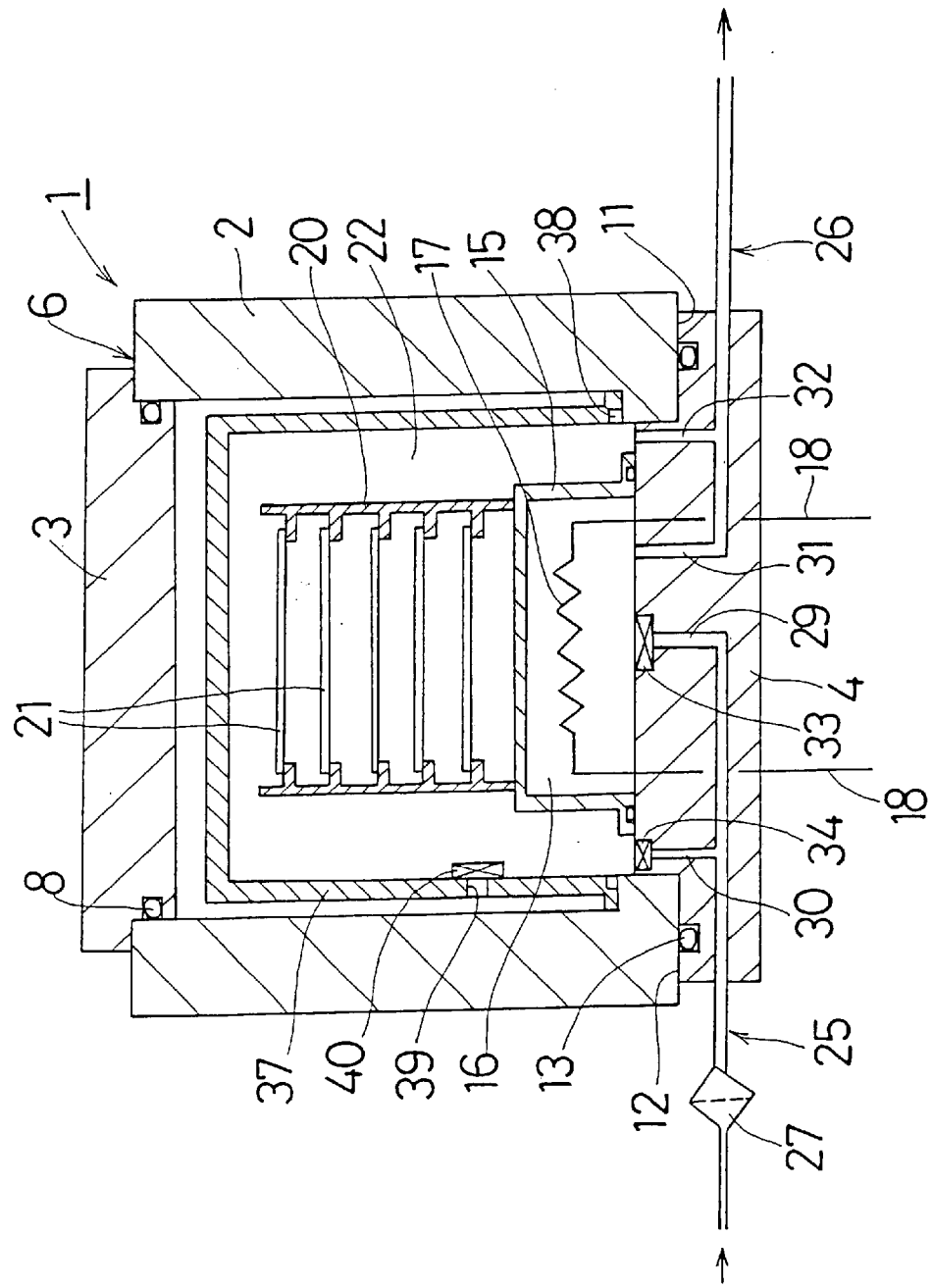
FIG. 1 is a sectional view showing one embodiment of the present invention.

FIG. 1 shows a vessel sectional constructional view of a supercritical gas extraction device which is a pressure processing device. In FIG. 1, a pressure vessel 1 forms a processing space by a vessel cylinder 2, an upper lid 3, and a lower lid 4. The interior of the pressure vessel 1 is maintained at a high pressure atmosphere for the supercritical processing. The upper lid 3 is secured to the vessel cylinder 2 by means of a bolt (not shown) in order to hold internal pressure of the pressure vessel 1, and in the normal operation, use is made in the state that the vessel cylinder 2 and the upper lid 3 remain secured to each other. With this, the vessel cylinder 2 and the upper lid 3 constitute a cylinder 6 which is a vessel body one end of which is opened. Accordingly, the pressure vessel 1 is provided with a cylinder 6 one end of which is closed, and a lid (a lower lid) 4 as a closing member for closing an opening on the other end of the cylinder 6. In the maintenance, the upper lid 3 can be mounted and detached from the vessel cylinder 2. A shaft seal 8 is provided between the upper lid 3 and the vessel cylinder 2 in order to seal internal pressure of the pressure vessel 1.

Although abbreviated, there is provided a pressing means for pressing the lower lid (a lid) 4 against the cylinder in an axial direction of the cylinder 6.

A lower end surface 11 of the vessel cylinder 2 (i.e., an open end surface of the cylinder 6) and an upper surface 12 of the lower lid 4 (i.e., an opposed end surface of the lid 4 opposite to an open end surface of the cylinder 6) are joining surfaces with which the both comes in contact.

A ring-like seal member 13 is provided between the open end surface 11 and the opposed end surface 12 which are the joining surfaces, and the lower lid 4 has the upper surface 12 pressed against the lower end surface 11 of the vessel cylinder 2 through the seal member 13. The aforesaid pressing means may be, though not shown, in the normal operation, either that in the state where the cylinder 6 formed from the upper lid 3 and the vessel cylinder 2 is fixed, it moves the lower lid 4 up and down, or that in the state where the lower lid 4 is fixed, it moves the cylinder 6 up and down.

In this case, in either case, since the seal member 13 between the lower lid 4 and the vessel cylinder 2 will not slide with the pressure vessel 2 every operation, no abrasion occurs in the seal member 13, and no minute particle resulting from the abrasion of the seal member 13 generates.

A diaphragm 15 is provided, within the pressure vessel 1, so as to form an airtight space, the diaphragm 15 being mounted airtightly on the upper surface of the lower lid 4, the airtight space formed by the diaphragm 15 serving as a heater storage chamber 16, and an electric (heating) heater 17 as a heating means is provided in the heater storage chamber 16. Electric power is supplied to the electric heater 17 through a heater electrode 18 which airtightly extends through the lower lid 4.

For example, a boat vessel 20 is placed and secured to the diaphragm 15. A plurality of stages of thin disk-like objects to be processed 21 such as wafers are placed on the boat vessel 20, and the outward of the diaphragm 15 within the pressure vessel 1 serves as a processing chamber 22. A thermometer (abbreviated in the figure) for the measurement of an atmosphere temperature is provided in the vicinity of the objects to be processed 21 of the pressing chamber 22, and the electric heater 17 is controlled so that the atmosphere temperature within the processing chamber 22 assumes the desired temperature on the basis of the temperature measured by the thermometer. In this case, since the electric heater 17 as the heating means is provided within the pressure vessel 1, the atmosphere temperature in the vicinity of the object to be processed 21 can be controlled with accuracy, and the excellent control responsiveness is obtained. Therefore, the precise processing becomes enabled, and the enhancement of productivity becomes enabled.

For a member constituting the electric heater 17, material is selected which is free from generation of dust from the surface, but even if the minute particles occur, it is possible to prevent the movement of the minute particles into the processing chamber 22 by the diaphragm 15.

Reference numeral 25 designates a fluid introducing passage, and 26 designates a fluid discharging passage, which is designed so that a supercritical fluid (gas) is introduced from outside into the pressure vessel 1 through the fluid introducing passage 25 and the supercritical fluid (gas) is discharged to the outside from the interior of the pressure vessel 1 through the fluid discharging passage 25. A filter 27 for supplementing superminute particles is provided halfway the fluid introducing passage 25 to as to be able to prevent the minute particles within the supercritical fluid moving into the pressure vessel 1.

The diaphragm 15 airtightly isolates the processing chamber 22 from the heater storage chamber 16 by a seal, and therefore, in order to prevent the diaphragm 15 from being damaged due to a pressure difference between the inside and outside of the diaphragm 15, communicating passages 29, 30 which individually communicate with the inside and outside of the diaphragm 15 are respectively provided in the gas introducing passage 25 to the pressure vessel 1. Further, communicating passages 31, 32 which individually communicate with the inside and outside of the diaphragm 15 are respectively provided in the gas discharging passage 26. Thereby, the fluid introducing passage 25 and the fluid discharging passage 26 to the pressure vessel 1 respectively individually communicate with the inside and outside of the diaphragm 15 within the pressure vessel 1 from the outside.

In ports on the pressure vessel 1 side of the communicating passages 29, 30 of the fluid introducing passage 25 are provided filters 33, 34 for supplementing the superminute particles. Thereby, it is possible to doubly prevent the minute particles within the supercritical fluid from moving into the processing chamber 22.

A heat insulating layer 37 is provided internally of the pressure vessel 1. The heat insulating layer 37 is formed of material which is as airtight as possible, and particularly, since the heat insulating layer 37 also has the possibility of being a source for generating the superminute particles, for material for at least the innermost surface of the heat insulating layer 37, airtight material is employed to thereby prevent also the superminute particles from the heat insulating layer 17 from entering inside the heat insulating layer 37.

The heat insulating layer 37 is mounted integrally on the vessel cylinder of the pressure vessel 1, but an airtight seal 38 is provided on the mounting surface thereof so that the heat insulating layer 17 airtightly isolates the inside from the outside of the heat insulating layer 37. Similarly to the case of the aforementioned diaphragm 15, a communicating passage 39 for communicating the inside and outside of the heat insulating layer 37 is provided, so as not to damage the heat insulating layer 37 due to a pressure difference between the inside and outside of the heat insulating layer 37, and a filter 40 for supplementing the superminute particles is provided halfway the innermost surface side of the communicating passage 39.

By the provision of the heat insulating layer 37, power to be charged into the electric heater 17 is saved without unnecessarily heating the pressure vessel 1 such as the vessel cylinder 2. Further, the atmosphere temperature in the vicinity of the object to be processed 21 can be controlled with accuracy, the control responsiveness is excellent, the precise processing becomes enabled, and the enhancement of productivity becomes enabled.

While in the above-described embodiment, the vessel cylinder 2 and the upper lid 3 constitute the cylinder 6 one end of which is opened, and the lower lid 4 constitutes the lid for closing an opening of the other end of the cylinder 6, it is noted that the vessel cylinder 2 and the lower lid 4 may constitute a cylinder one end of which is opened, and the upper lid 3 constitutes the lid for closing an opening of the other end of the cylinder 6, in which case, the seal member 13 may be provided between the upper end surface of the vessel cylinder 2 (i.e., the open end surface of the cylinder) and the lower surface of the upper lid 3 (i.e., the opposed end surface of the upper lid 3 opposite to he open end surface of the cylinder). Further, the cylinder 6 may be laterally-directed or the like in place of being longitudinally-directed.

Figure 2:
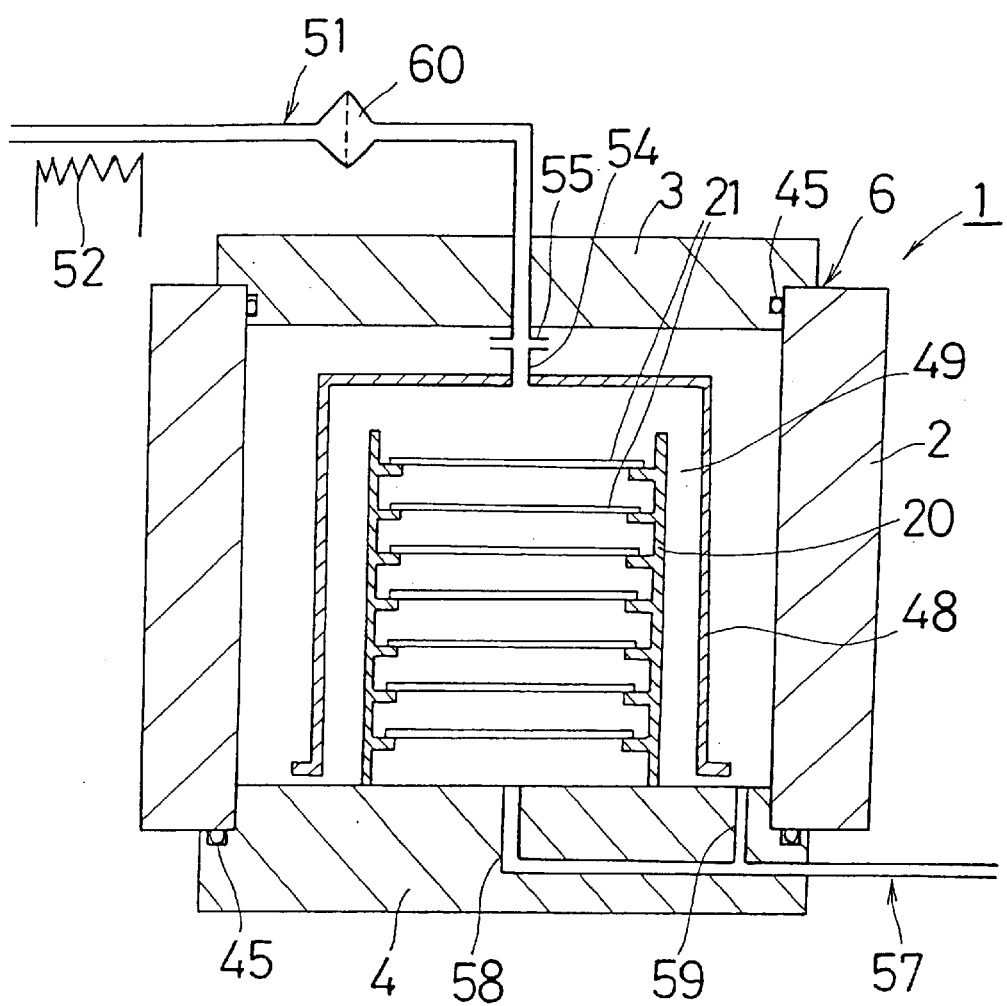
FIG. 2 is a sectional view showing a further embodiment of the present invention.

FIG. 2 shows a further embodiment. Similarly to the case of the embodiment shown in FIG. 1, a pressure vessel 1 forms a processing space by a vessel cylinder 2, an upper lid 3, and a lower lid 4. The interior of the pressure vessel 1 is maintained at a high pressure atmosphere for the supercritical processing. The upper lid 3 is secured to the vessel cylinder 2 by means of a bolt (not shown) in order to hold internal pressure of the pressure vessel 1, and in the normal operation, use is made in the state that the vessel cylinder 2 and the upper lid 3 remain secured to each other. With this, the vessel cylinder 2 and the upper lid 3 constitute a cylinder 6 which is a vessel body one end of which is opened. Accordingly, the pressure vessel 1 is provided with a cylinder 6 one end of which is closed, and a lid (a lower lid) 4 as a closing member for closing an opening on the other end of the cylinder 6. In the maintenance, the upper lid 3 can be mounted and detached from the vessel cylinder 2. A shaft seal 45 is provided between the upper lid 3 and the vessel cylinder 2 in order to seal internal pressure of the pressure vessel 1.

Although abbreviated, there is provided a pressing means for pressing the lower lid (a lid) 4 against the cylinder in an axial direction of the cylinder 6.

A boat vessel 20 is placed on the lower lid 4, and an object to be processed 21 such as a wafer is set to the boat vessel 20.

A seal member 45 is provided between the lower end of the vessel cylinder 2 and the upper surface of the lower lid 4.

The boat vessel 20 and the object to be processed 21 are further surrounded by a cylindrical diaphragm 48 upper surface of which is closed. The diaphragm 48 is placed on the lower lid 4, and the diaphragm 48 is internally formed with a processing chamber 49.

A fluid introducing passage 51 to the pressure vessel 1 is provided so as to extend through the upper lid 3, and a (heating) heater 52 for heating a fluid is provided halfway of the fluid introducing passage 51, the fluid in the fluid introducing passage 51 being introduced, in a supercritical state, into the processing space of the pressure vessel 1 from the upper lid 3.

The fluid introducing passage 51 is branched into a main introducing passage 54 and a sub-introducing passage 55 within the processing apace of the pressure vessel 1, the main introducing passage 54 extending through the upper wall of the diaphragm 48 and being communicated with the processing chamber 49 within the diaphragm 48, and the fluid is introduced into the processing chamber 49 within the diaphragm 48 from the main introducing passage 54. The sub-introducing passage 55 terminates at the outside the diaphragm 48 within the pressure vessel 1 to cause a part of fluid flowing into the processing chamber 49 of the pressure vessel 1 to flow also outside the diaphragm 48. Accordingly, the diaphragm 48 for housing the object to be processed 21 is provided within the pressure vessel 1, and the fluid introducing passage 51 is to the pressure vessel 1 is provided so that the greater part of fluids flowing into the pressure vessel 1 flows into the diaphragm 48.

A fluid discharge passage 57 to the pressure vessel 1 is provided so as to extend through the lower lid 4. The fluid discharge passage 57 is branched into a main discharge passage 58 and a sub-discharge passage 59, and the fluids inside and outside the diaphragm 48 can be discharged outside from the respective processing spaces.

A filter 60 for supplementing superminute particles is provided in the pressure vessel 1 side port halfway the fluid introducing passage 51 to be able to prevent minute particles within the fluid from entering into the processing chamber 49 of the pressure vessel 1.

Figure 3:
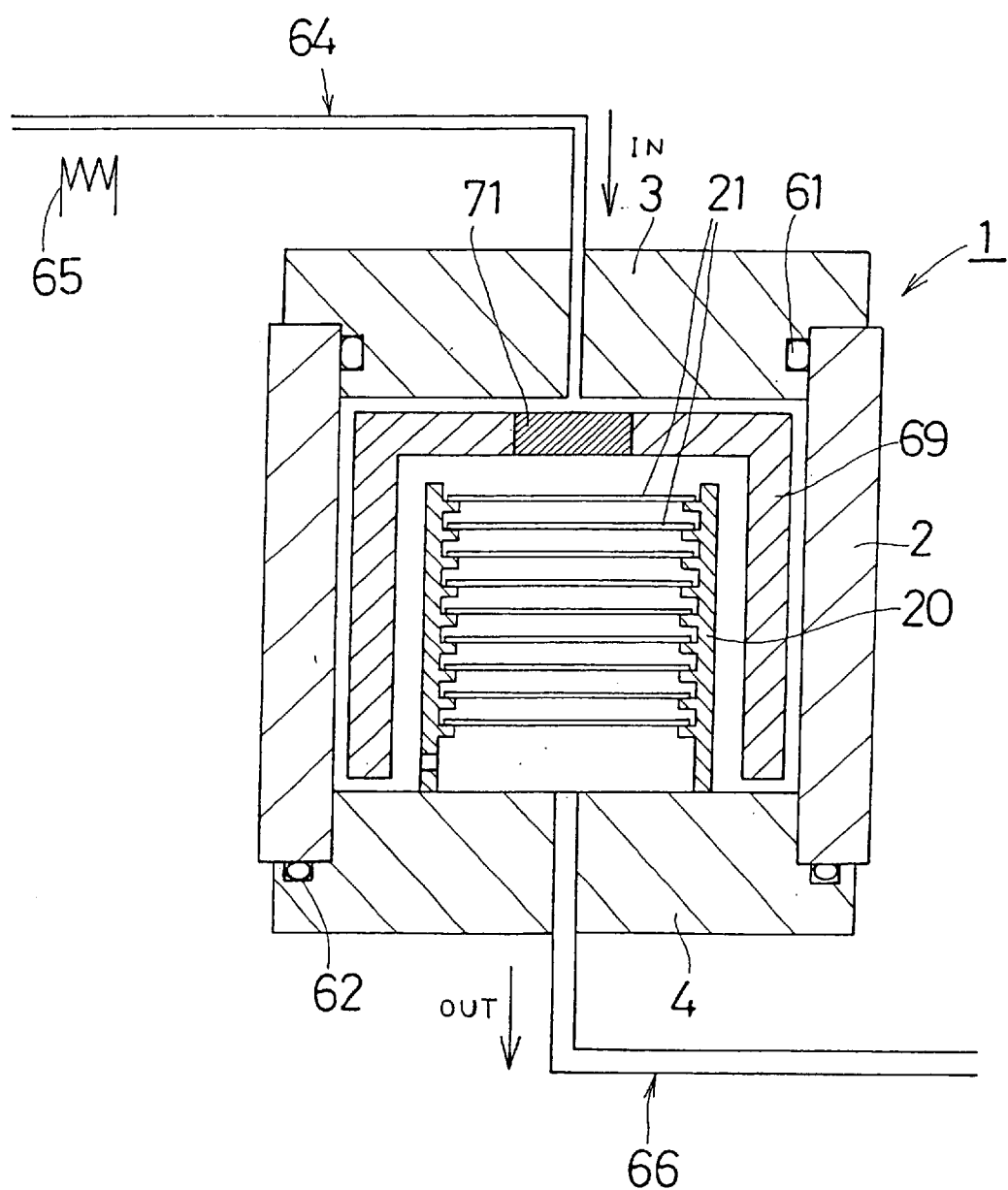
FIG. 3 is a sectional view showing another embodiment of the present invention.

FIG. 3 shows another embodiment. Similarly to the case of the embodiment shown in FIG. 1 or FIG. 2, the pressure vessel 1 forms a processing space by a vessel cylinder 2, an upper lid 3, and a lower lid 4. The interior of the pressure vessel 1 is maintained at a high pressure atmosphere for the supercritical processing.

Within the pressure vessel 1, a boat vessel 20 for placing a thin disk-like object to be processed 21 such as a wafer is placed and secured to the lower lid 4. This boat vessel 20 has the constitution similar to that of the case of the embodiment described above, and is formed of a material, for example, quartz, or SiC and the like. The object to be processed 21 such as a wafer is set to the boat vessel 20.

In order to maintain the internal pressure of the pressure vessel 1, a pressing means for pressing the upper lid 3 and the lower lid 4 in the axial direction with respect to the vessel cylinder 2 is provided. A seal member 61 is provided between the inner peripheral surface of the upper end of the vessel cylinder 2 and the outer peripheral surface of the lower part of the upper lid 3, and a seal member 62 is provided between the lower end of the vessel cylinder 2 and the upper surface of the lower lid 4. For the seal members 61 and 62, for example, an O-ring, a U-packing, a V-packing and the like can be used.

A fluid introducing passage (piping) 64 for causing a high pressure fluid (a supercritical fluid, a sub-critical fluid) to flow into the pressure vessel 1 is connected to the upper lid 3, and a heater 65 as a heating means for heating a fluid for placing in a supercritical state is installed halfway of the fluid introducing passage 64. A fluid discharge passage (piping) 66 for following out the fluid is installed on the lower lid 4.

A diaphragm 69 for separating an atmosphere is installed between the object to be processed 21 and the pressure vessel 1. The diaphragm 69 is formed of quartz or ceramics having a low heat conductivity, metal (for example, alumina, $Si_3N_4$, SUS or the like) and so on so as to prevent a temperature of fluid in a supercritical (or sub-critical) state flown in through the fluid introducing passage 64 from lowering. Further, on the side of the diaphragm 69 into which fluid flows (upper part in FIG. 3), a filter 71 for removing dust or the like is installed. The filter 71 is necessary to withstand a temperature for placing a supercritical (or sub-critical) state and to select a material which is stable in a supercritical (or sub-critical) state, preferably, metal.

In the embodiment shown in FIG. 3, the fluid flows in from the top (upper lid 3) and is discharged from the bottom (lower lid 4), but instead, it may be designed so that the fluid flows in from the bottom (lower lid 4) and is discharged from the top (upper lid 3), or it is also possible that the fluid flows in from the side of the pressure vessel 1 and flows out to the opposite side. In these cases, the filter 71 may be installed on the lower side where the fluid flows in from the bottom, and installed in the vicinity of the fluid inlet on the side where the fluid flows in from the side. In either case, the fluid preferably flows in one direction (from top to bottom, or from bottom to top, or from side to opposite side) from a viewpoint of removal of particles.

Figure 4:
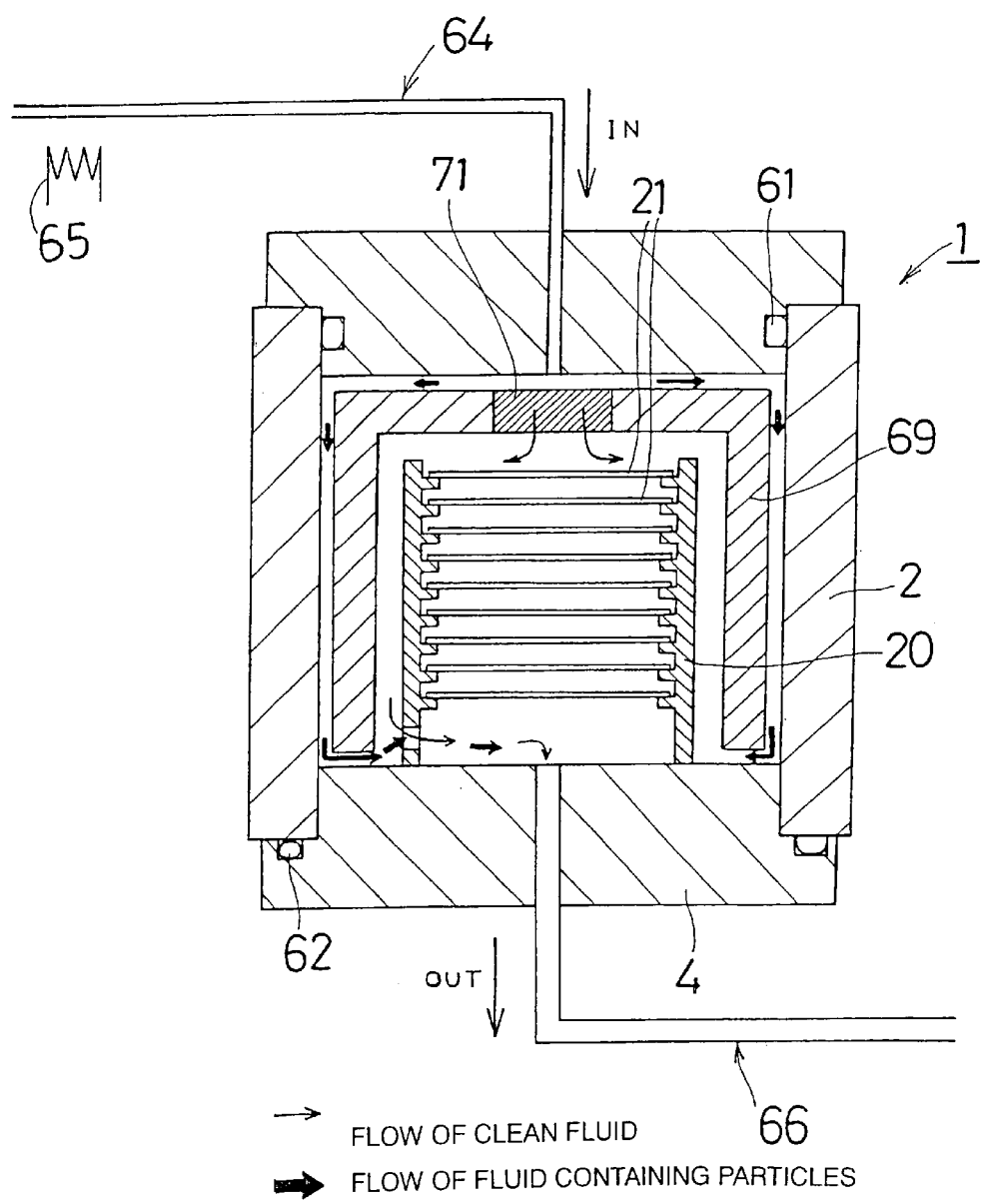
FIG. 4 is a sectional view showing a flow of fluid in FIG. 3.

In the embodiment shown in FIG. 3, the fluid flows in one direction, from top to bottom, and the lower part of the diaphragm 69 is not connected airtightly. Therefore, it is necessary to pay attention to the flow rate of fluid and further design so that the fluid does not flow from bottom to top (even partly) depending on the construction so that the fluid flows in one direction, as shown in FIG. 4.

Figure 5:
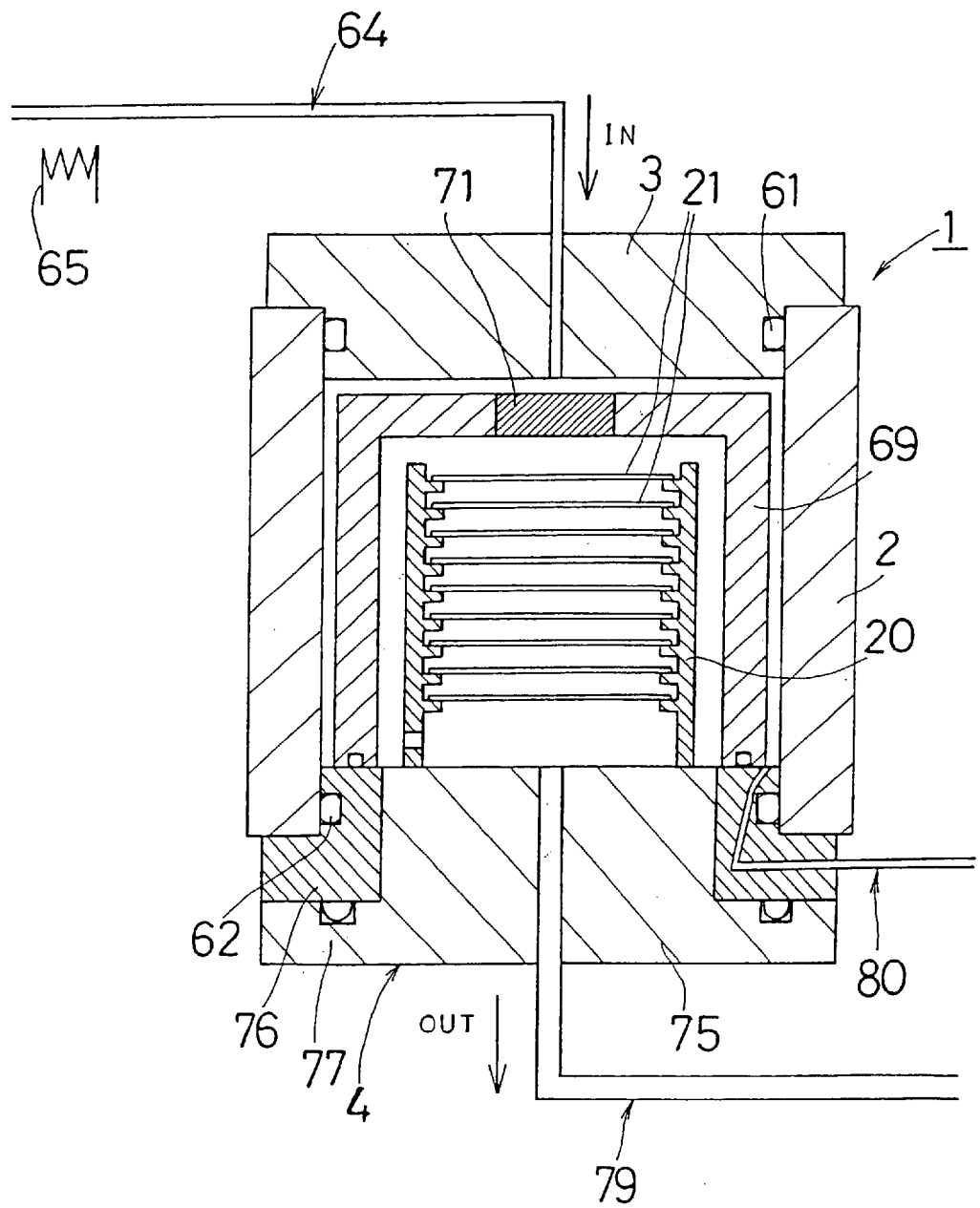
FIG. 5 is a sectional view showing another embodiment.

FIG. 5 shows a modification of the embodiment shown in FIG. 3, showing a method for considerably relieving the problem relative to the fluid flow as in the embodiment shown in FIG. 3. That is, in the embodiment shown in FIG. 5, the lower lid 4 is of a double construction in which the lower lid 4 is divided into a first lid part 75 and a second lid part 76, and a seal member 77 is interposed between the first lid part 75 and the second lid part 76. The diaphragm 69 is secured airtightly to the second hd part 76, a first fluid discharge passage 70 in communication with the interior of the diaphragm 69 within the pressure vessel 1 is provided in the first lid part 75 of the lower lid 4, and a second fluid discharge passage 80 in communication with the outside of the diaphragm 69 within the pressure vessel 1 is provided in the second lid part 76 of the lower lid 4.

Figure 6:
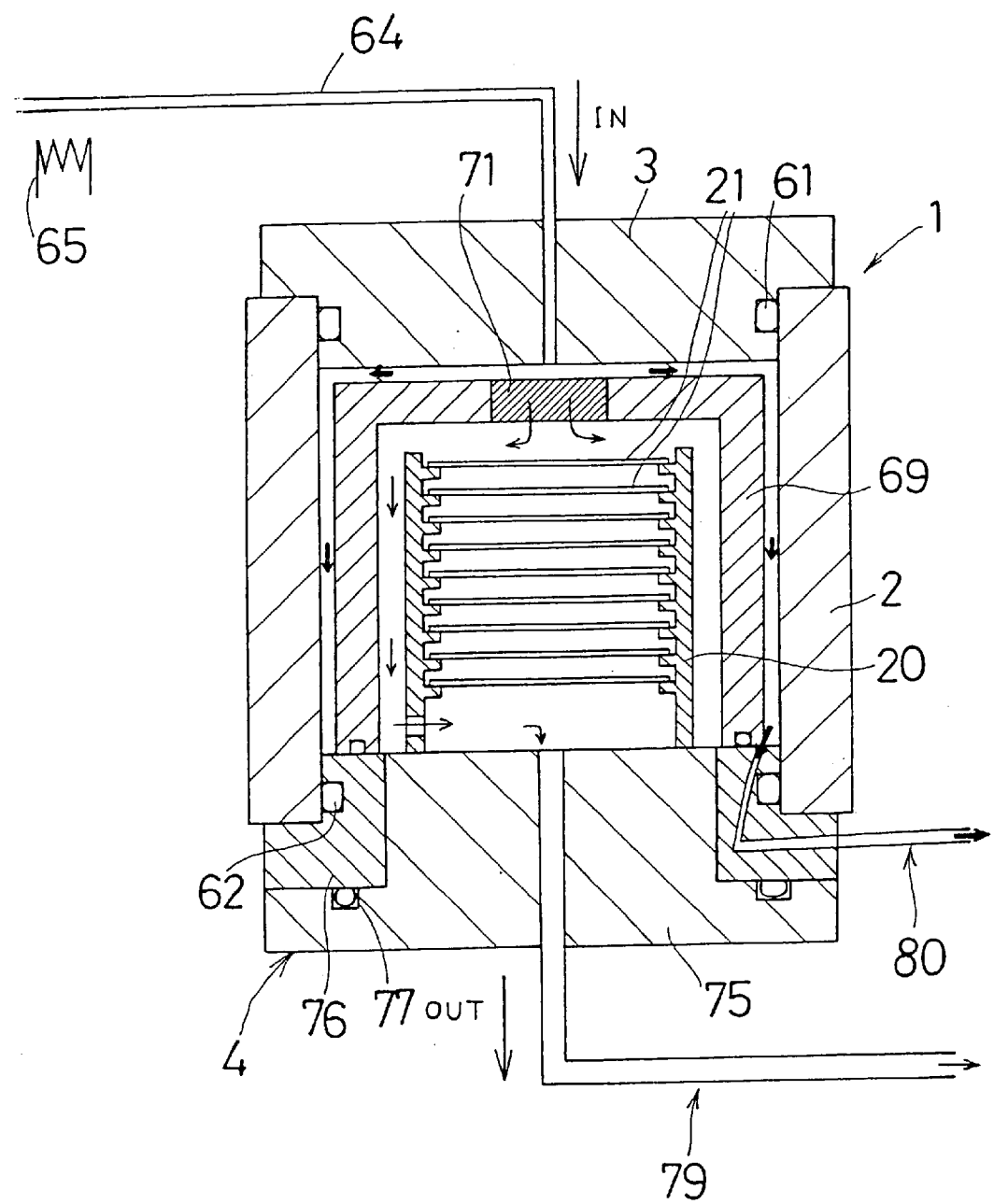
FIG. 6 is a sectional view showing a flow of fluid in FIG. 5.
Figure 7:
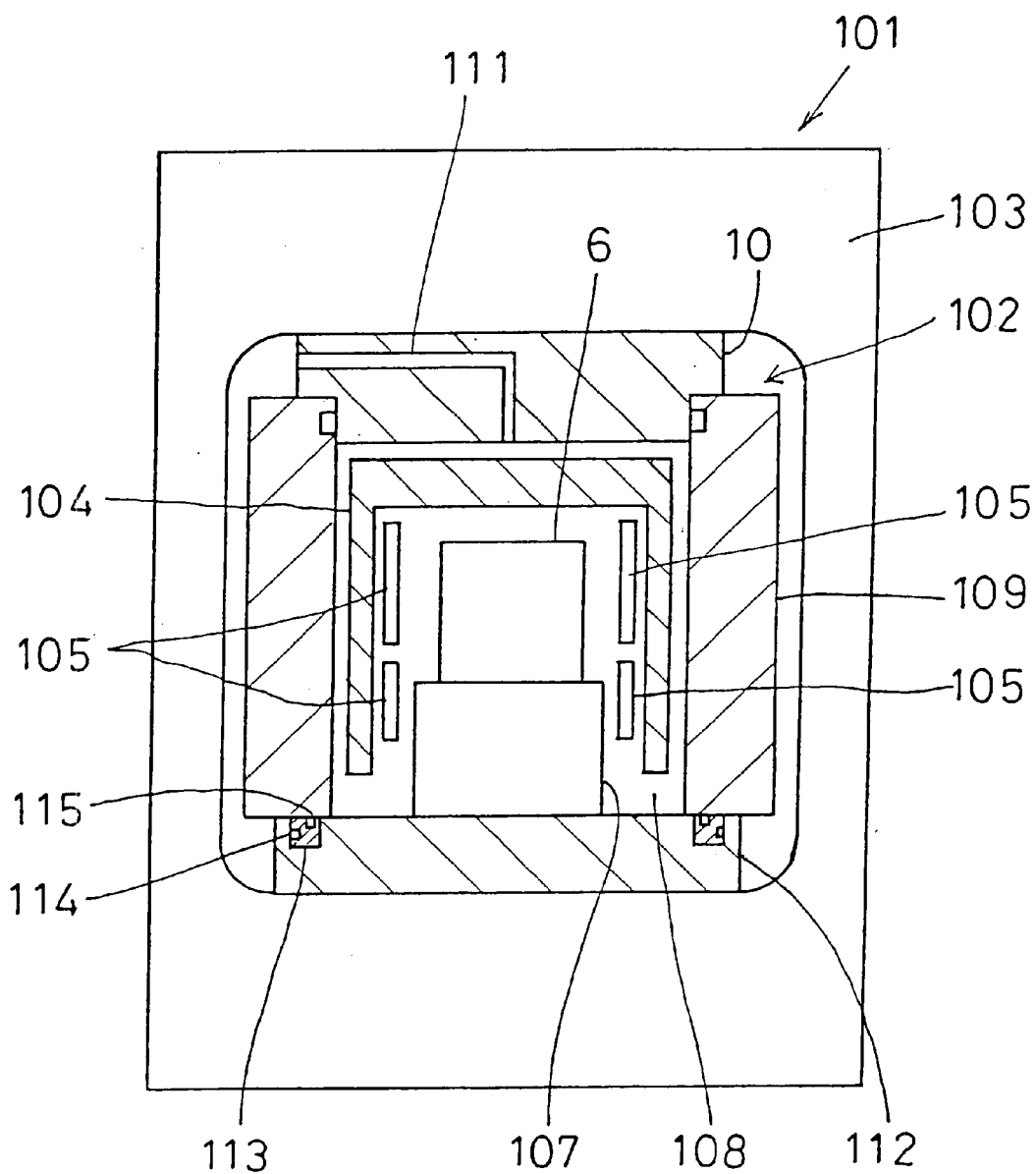
FIG. 7 is a sectional view showing a pressure processing device according to another embodiment.
Figure 8:
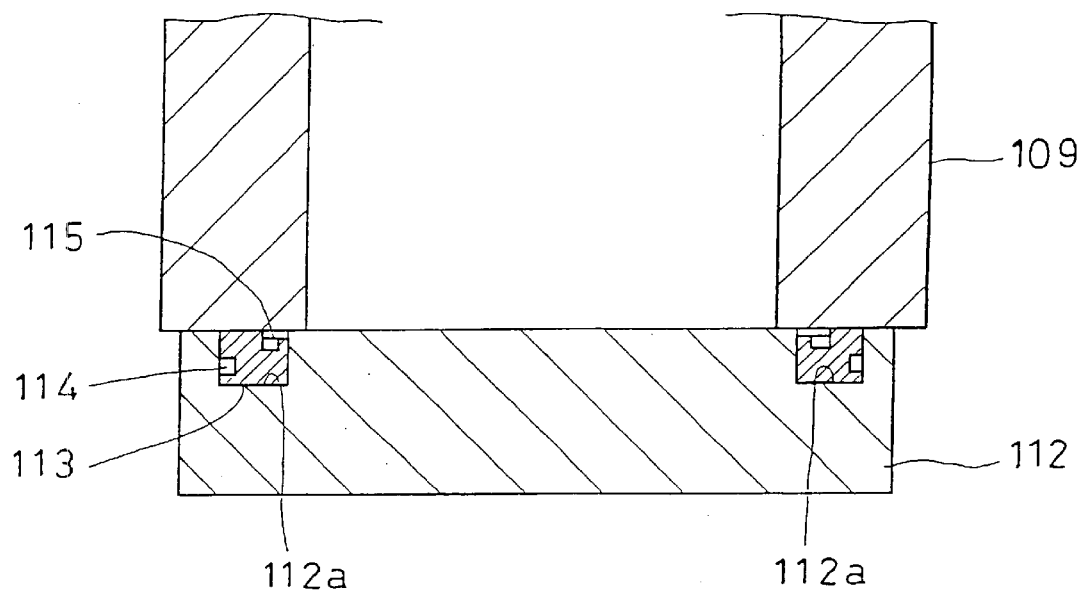
FIG. 8 is an enlarged view in the vicinity of a lower lid of FIG. 7.

Accordingly, as shown in FIG. 6, the fluid entered into the diaphragm 69 passing through the filter 71 from the fluid introducing passage 64 is discharged outside passing through only the first fluid discharge passage 79, and the fluid entered into the outside of the diaphragm 69 of the pressure vessel 1 passing through the fluid introducing passage 64 is discharged outside passing through only the second fluid discharge passage 80. Therefore, the object to be processed 21 within the pressure vessel 1 comes in contact with only a clean fluid (a fluid not containing particles) which flows through the filter 71.

In the embodiment shown in FIG. 5, there is employed a double construction in which the lower lid 4 is divided into a first lid part 75 and a second lid part 76, but instead, it may be designed so that the lower lid 4 is not divided but the diaphragm 69 is secured to the lid 4 airtightly, and the lower lid 4 is provided with a first fluid discharge passage 79 in communication with the interior of the diaphragm 69 within the pressure vessel 1 and a second fluid discharge passage 80 in communication with the outside of the diaphragm 69 within the pressure vessel 1.

While in the aforementioned embodiment, a description has been made of the case where the present invention is applied to the pressure processing device for placing the object to be processed 21 in contact with the supercritical fluid within the pressure vessel 1 to process the same, it is to be noted that the present invention is not limited thereto, but is applied to a pressure processing device for placing the object to be processed 21 in contact with a sub-critical fluid or a liquefied gas within the pressure vessel 1 to process the same. Further, the object to be processed 21 is not limited to a wafer but other objects may be employed.

FIGS. 7 to 10 show a pressure processing device 101 according to still another embodiment of the present invention. The pressure processing device comprises a pressure vessel (a high pressure vessel) 102, a window frame-like frame 103 for bearing a load caused by gas pressure generated within the pressure vessel by both sides in an axial direction of the vessel of the pressure vessel 102, and an electric furnace 108 comprising a heat insulating construction 104 provided within the pressure vessel 102, a heater 105 and a place bed for an object to be processed 107 for supporting an abject to be processed 106.

The pressure vessel 102 comprises a cylindrical vessel body 109 having a doughnut-shape section upper and lower portions of which are opened, an upper lid 110 having a gas supply and discharge passage for closing an upper open end of the cylindrical vessel body 109, and a lower lid (an opening and closing member) 112 for closing closeably a lower open end of the cylindrical vessel body 109. The lower lid 112 has its upper surface placed in contact with the lower end surface of the cylindrical vessel body 109 to close the opening. That is, the lower end surface of the cylindrical vessel body 109 and the upper surface of the lower lid 112 are the joining surface at which both the surfaces come in contact.

The opening and closing operation of the pressure vessel 102, that is, the taking in- and out operation for the object to be processed 106 is carried out by disengaging the frame 103 from the pressure vessel 102, and then moving down the lower lid 112 by means of an elevating means not shown.

Figure 9:
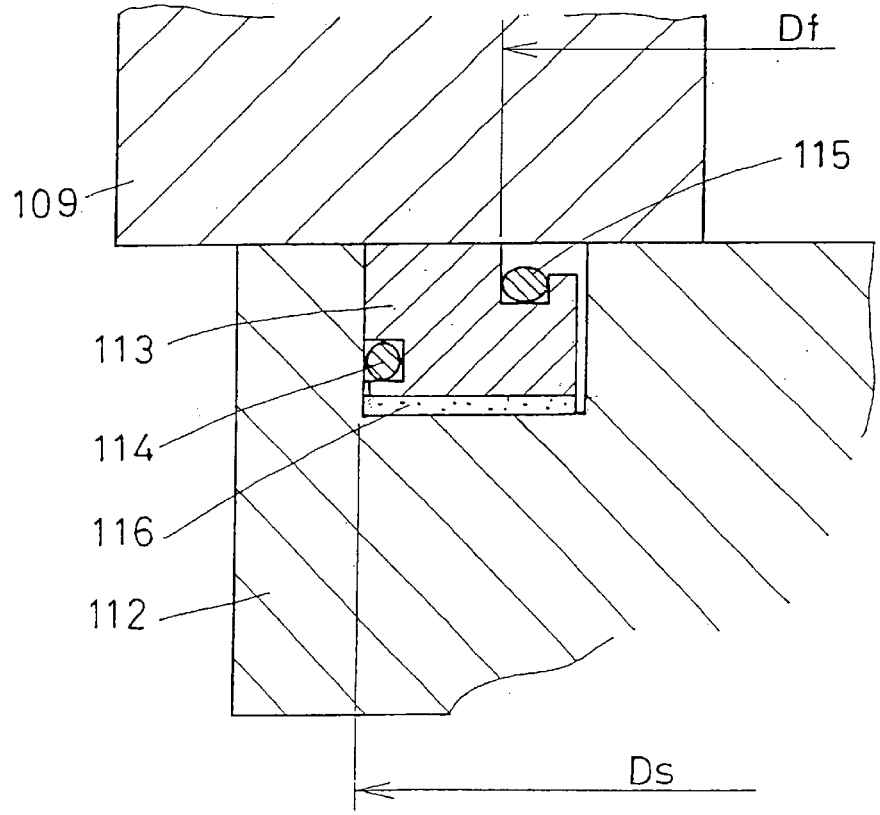
FIG. 9 is an enlarged view showing a ring member of FIG. 8.

Out of the upper surface of the lower lid 112, the joining surface (a joining part) with respect to the cylindrical vessel body 109 is formed with a ring-like groove 112a in the form of a ring as viewed in plane. A ring member 113 is detachably fitted in the ring-like groove 112a. The ring member 113 is provided with a ring-like joining surface-side seal member (a face seal) 115 at a part in contact with the lower end of the cylindrical vessel body 109, that is, on the other joining surface side. Further, on the outer peripheral side of the ring member 113 is provided an outer peripheral side seal member (a shaft seal) 114. As shown in FIG. 9, the diameter Df of the joining surface side seal member 115 is smaller than the diameter Ds of the outer peripheral side seal member 114.

A ring-like elastic element having a process fluid (gas, liquid) transmission for processing the object to be processed 106 is disposed below the ring member 115.

When the frame 103 is set to the pressure vessel 102 for carrying out the pressure processing within the pressure vessel 102, the axial load of the vessel exerting on the upper lid 110 and the lower lid 112 increases as the pressure within the pressure vessel 102 rises, as a consequence of which the window frame-like frame 103 extends vertically.

Therefore, as viewed from the cylindrical vessel body 109, the upper lid 110 and the lower lid 112 move upward and downward, respectively, by a portion corresponding to the extension of the window frame-like frame 3.

Figure 10:
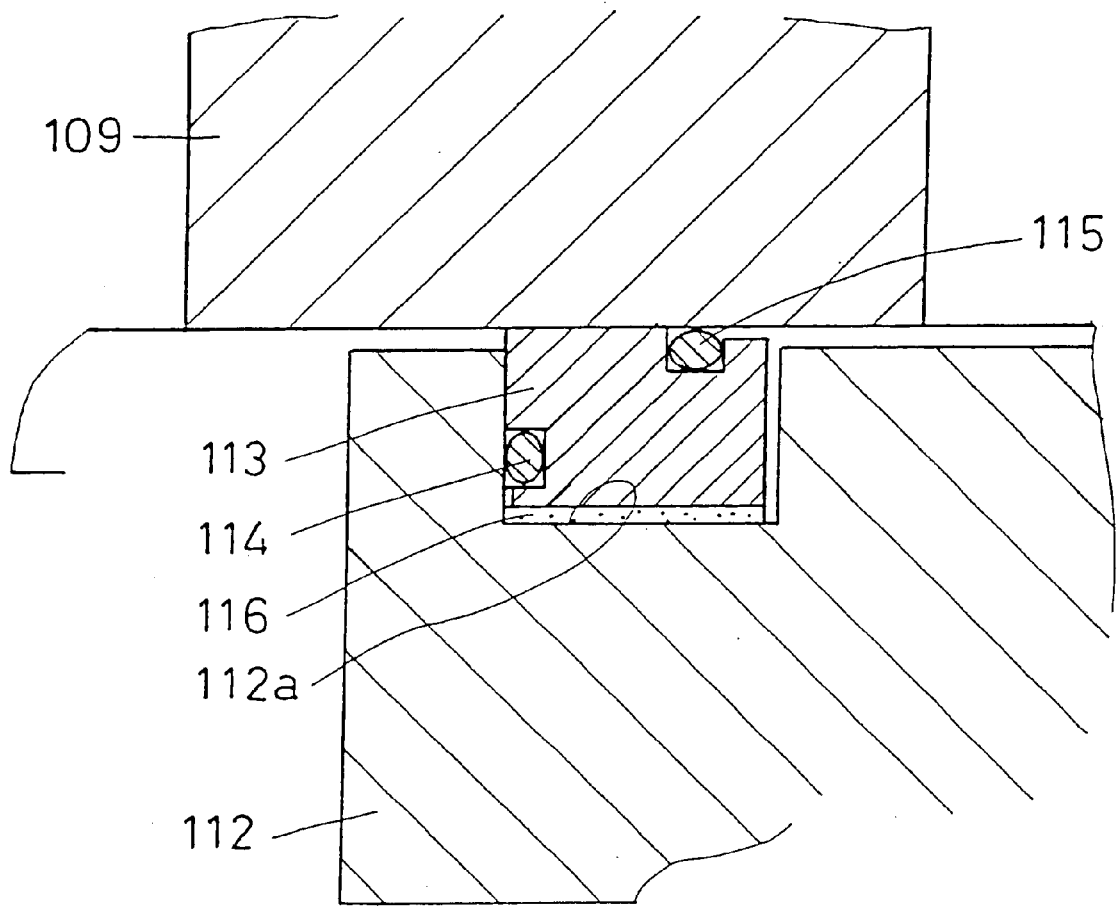
FIG. 10 is a view corresponding to FIG. 8 where a clearance L appears above the lower lid.
Figure 11:
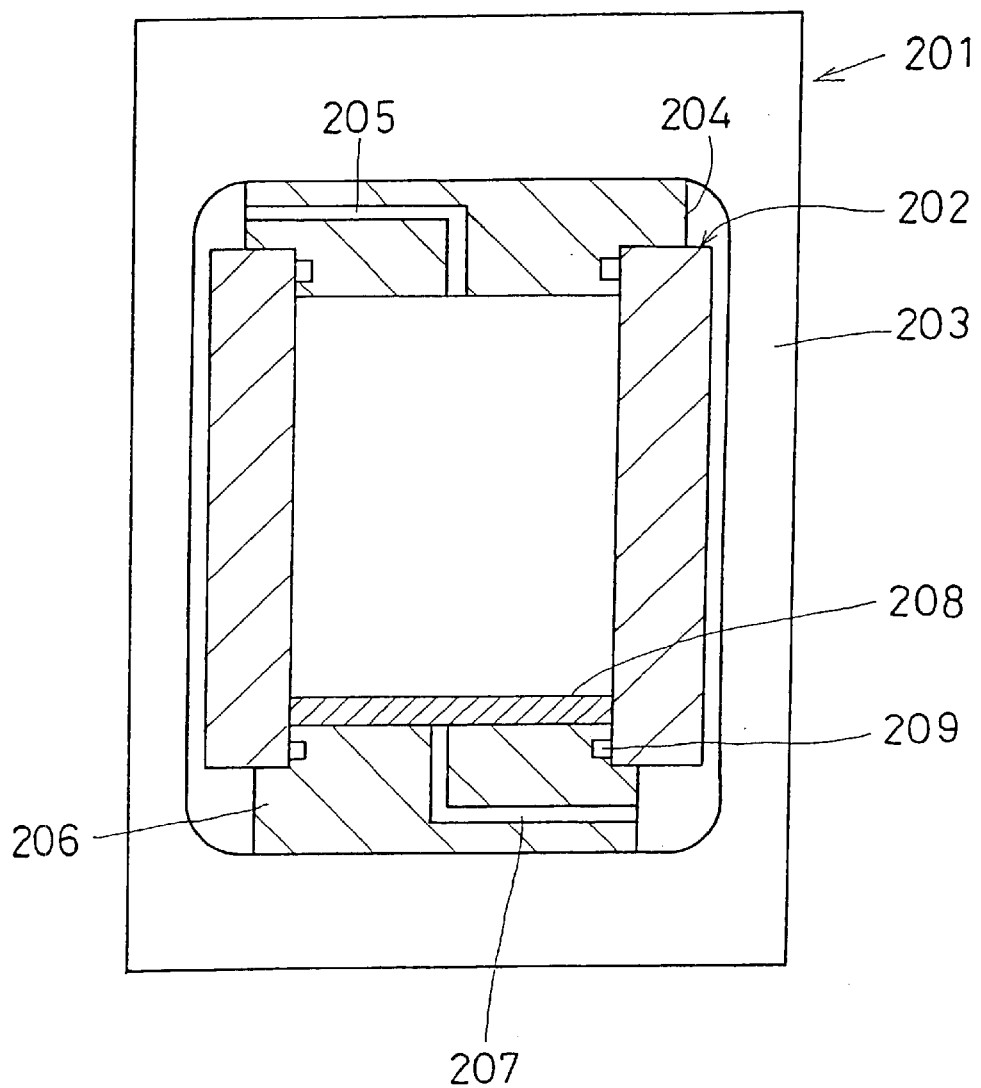
FIG. 11 is a sectional view showing a pressure processing device according to still another embodiment.
Figure 12:
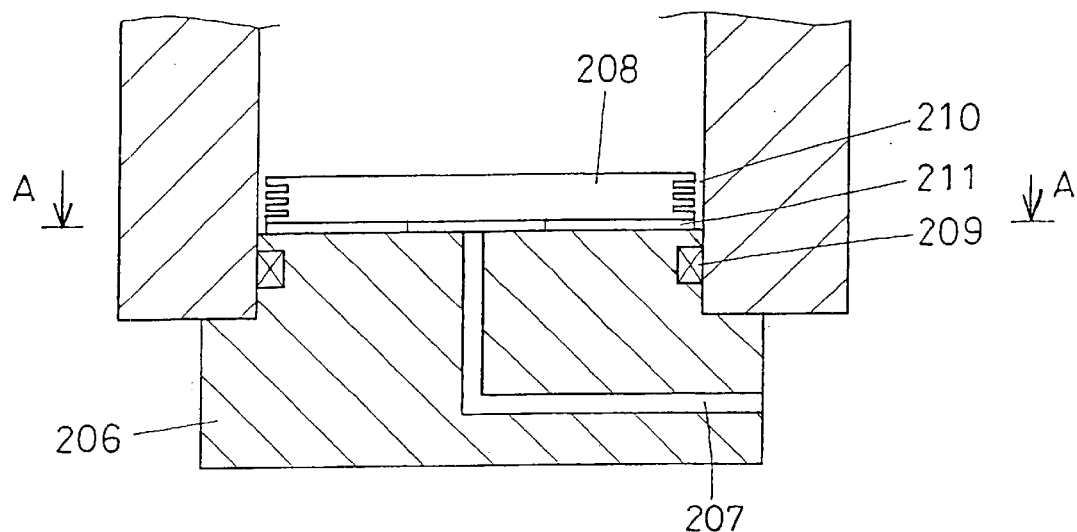
FIG. 12 is an enlarged view in the vicinity of a lower lid of FIG. 11.
Figure 13:
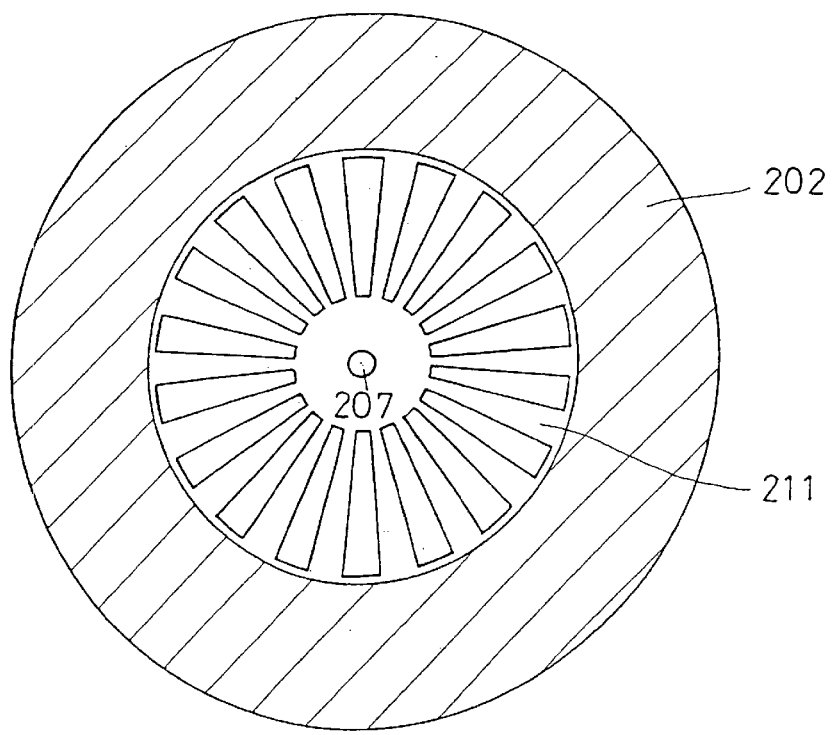
FIG. 13 is a sectional view taken on line A—A of FIG. 12.
Figure 14:
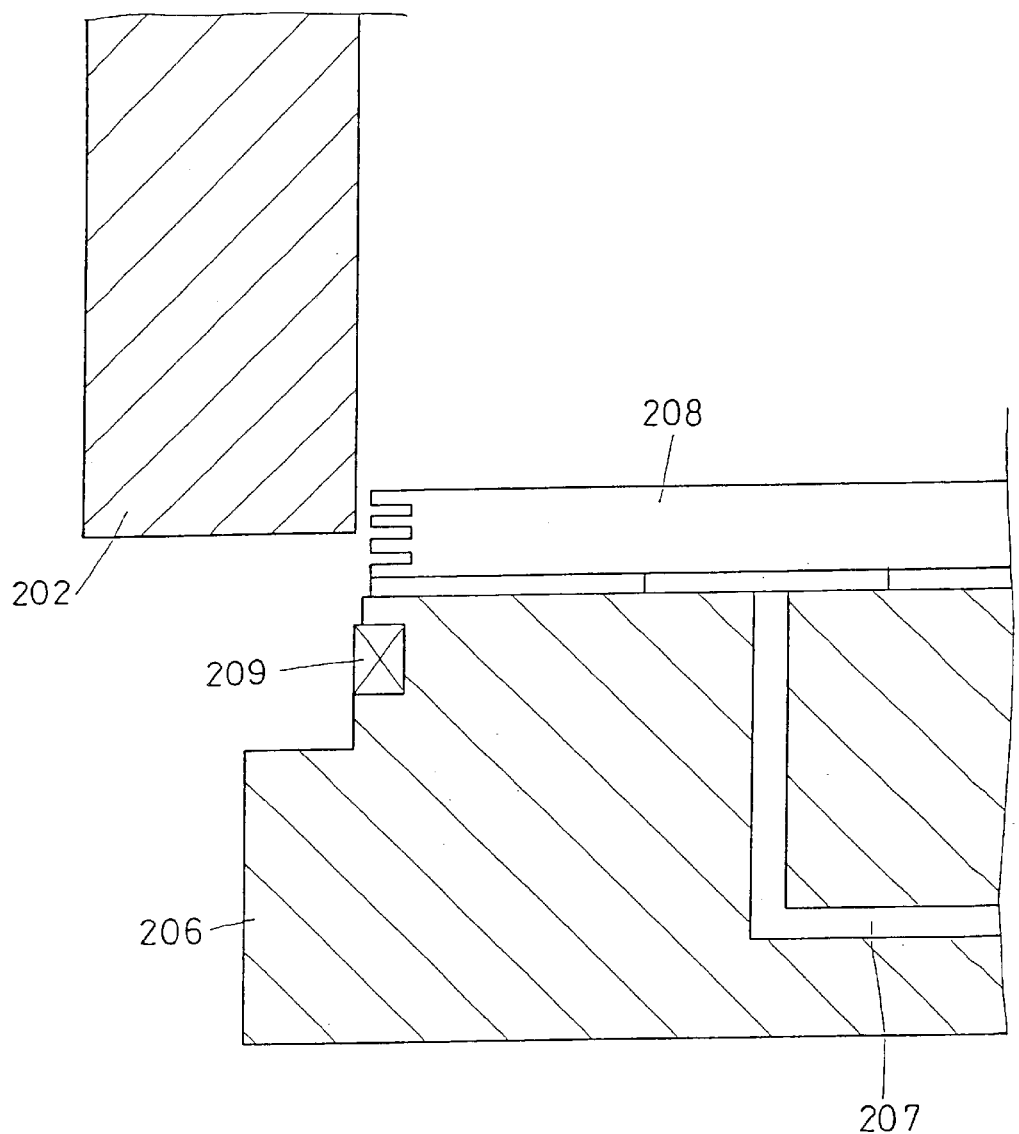
FIG. 14 is a view showing the state that the lower lid is moved down from the state of FIG. 12.
Figure 15:
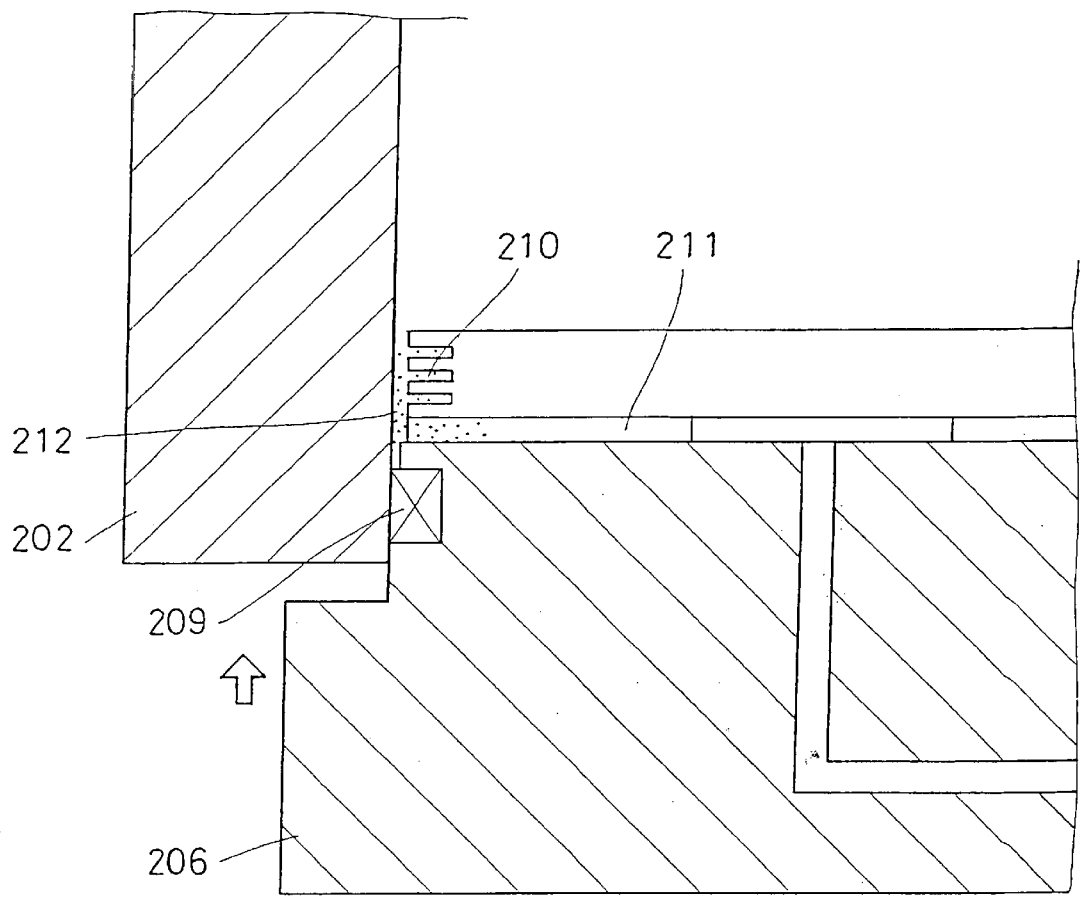
FIG. 15 is a view showing the state that the lower lid is moved up from the state of FIG. 14.
Figure 16:
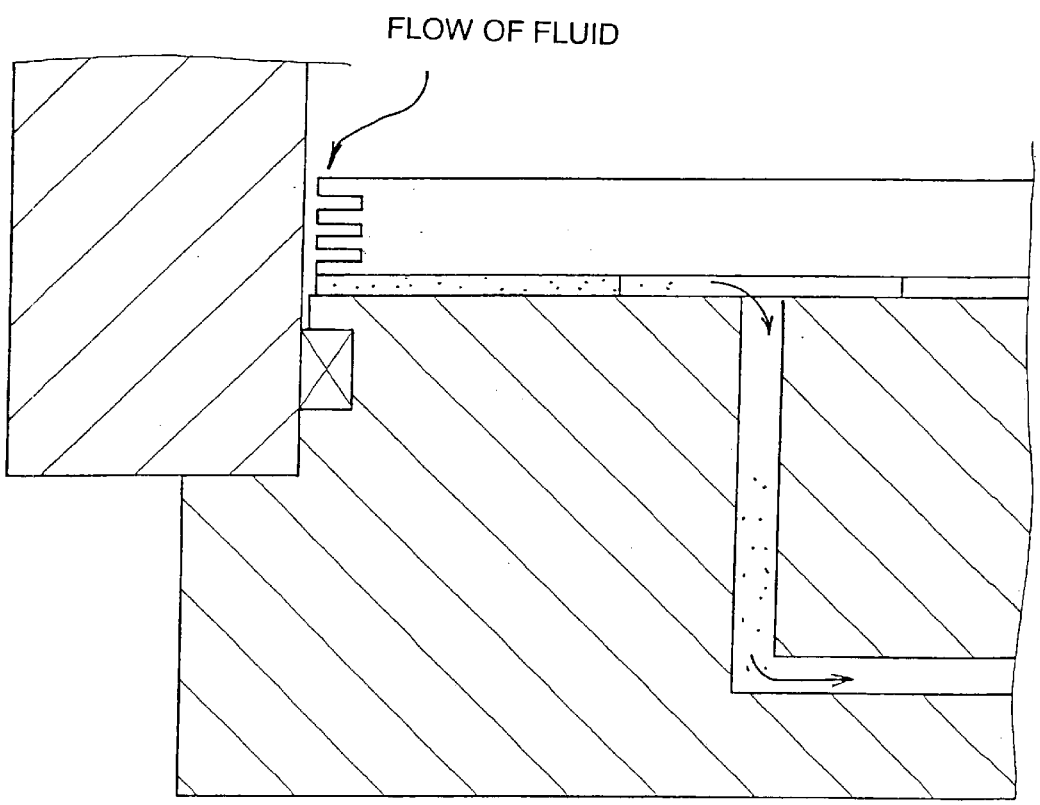
FIG. 16 is a view corresponding to FIG. 12 showing a flow of fluid after the lower lid has been moved up.

In the conventional shaft seal construction, when the lid is opened or closed, the sliding part of the O-ring exposes to the product side, and therefore, the worn gas of the O-ring resulting from the sliding movement of the O-ring becomes dust. According to the present embodiment, the lower lid 112 and the cylindrical vessel body 109 are of the construction for the face seal, and therefore, there occurs no problem as to the dust caused by the sliding movement of the seal member. Moreover, according to the construction of the present embodiment, even if a clearance L occurs relative to the cylindrical vessel body 109 due to the downward movement of the lower lid 112 as shown in FIG. 10, sealing is secured because the ring member 113 can be moved in an axial direction.

That is, when high pressure occurs within the pressure vessel 2, the upward push-up force according to the outside diameter Ds exerts on the seal ring 113 of the shaft seal 114. On the other hand, with respect to the face seal 115, the downward push-up force according to the outside diameter Df exerts. But due to the presence of a relationship of Ds>Df, the upward push-up force is always large.

More specifically, suppose that in the ring member 113, pressure inside the pressure vessel 2 is higher by P [MPa] than the outside thereof, a difference in a pressure receiving sectional area between the outside diameter Ds of the shaft seal 114 and the outside diameter Df of the face seal 115, that is, the load of $P \times \pi (Ds^2 - Df^2)/4$ always exerts upward. This upward force pushes up the ring member 113, and the face seal 115 is brought into close contact with the lower end of the high pressure cylinder 9 positively. Further, since the ring-like member 116 formed from an elastic element having a fluid transmission is provided between the ring member 113 and the ring-like groove 112a, the close contact can be enhanced.

FIGS. 11 to 16 show a pressure processing device (a supercritical extraction device) according to another embodiment of the present invention. The pressure processing device 201 comprises a cylindrical pressure vessel and a window frame-like frame 203 for bearing a load caused by fluid pressure generated within the pressure vessel by both sides in an axial direction of the vessel of the pressure vessel.

The pressure vessel comprises a cylindrical vessel body 202 having a doughnut-shape section, an upper lid 204 for closing an upper opening of the cylindrical vessel body 202 and having a fluid supply and discharge passage 205, and a lower lid for closing a lower opening of the cylindrical vessel body 202 and having a fluid supply and discharge passage 207.

The opening and closing operation of the pressure vessel, that is, the taking in- and out operation for an object to be processed is carried out by disengaging the frame from the pressure vessel 206, and then moving down the lower lid 206 as an opening and closing member for an opening by means of an elevating means not shown.

The lower lid 206 is fitted in the lower opening of the vessel body 2 to close the opening, and a ring-like shaft seal member 209 is provided on the outer peripheral part of the lower lid 206 serving as a joining interface (a sliding surface) relative to the vessel body 2.

On the upper surface of the lower lid 206, a plate 208 is secured to and mounted on the lower lid 206. This plate 208 is arranged so as to divide a processing space within the pressure vessel and the lower lid 206. The plate 209 is in the form of a labyrinth plate in which its outer peripheral surface is cylindrical having a predetermined thickness arranged to have a slight clearance relative to the inner peripheral surface of the vessel body 2, and having a labyrinth construction in which a rugged groove 210 formed in a diametrical direction is formed in the labyrinth form in the outer peripheral cylindrical surface.

The back surface (bottom surface) of the labyrinth plate 208, that is, the contact surface with the lower lid 206 is formed with a rugged groove 211 toward the center where the fluid discharge passage 207 is present from the outer periphery. This groove 211 comprises a fluid communication path (a discharge passage groove) for discharging a fluid in the processing space from the fluid discharge passage 207 through the range of the labyrinth construction.

The processing procedure done by the device 201 will be described hereinafter. First, an object to be processed (not shown) is placed on the lower lid 206 and the labyrinth plate 208. The lower lid 206 moves up and is fitted in the vessel body 202 (see FIGS. 14 and 15). Since when the lower lid 206 is fitted in the vessel body 202, the shaft seal 209 slidably moves on the inner surface of the vessel body 202, the worn gas of the seal caused by the sliding movement becomes dust (particles) 212. The particle 212 is trapped in the labyrinth plate 208 and the discharge passage groove 211 in the back of the labyrinth plate (see FIG. 15).

After the lower lid 206 has been completely fitted in the vessel body 202, the press frame 203 is closed to prepare for bearing the load caused by fluid pressure generated within the pressure vessel by both sides in an axial direction of the vessel of the pressure vessel.

High temperature and high pressure fluid, for example, carbon dioxide in a supercritical state flows from outside the pressure vessel into the pressure vessel through the fluid introducing passage 205 provided in the upper lid 204. After the pressure vessel is substantially filled with supercritical carbon dioxide, the supercritical carbon dioxide continues to flow from the fluid introducing passage 25, and at the same time, the supercritical carbon dioxide is discharged out of the fluid discharge passage 207 provided in the lower lid 6, and the supercritical processing progresses (see FIG. 1).

The particle 212 generated when the lower lid is mounted and trapped in the labyrinth groove 212 of the labyrinth plate 208 and the discharge passage groove 211 in the back of the labyrinth plate is discharged, with the discharge of the supercritical carbon dioxide, from the discharge passage groove 211 in the back of the labyrinth plate to the outside of the pressure vessel via the fluid discharge passage (see FIG. 6). Thereby, it is possible to prevent the particles from generation in the processing space. Moreover, since the shaft seal construction can be employed, the closing is positive.

FIGS. 17 to 20 show a pressure processing device according to another embodiment of the present invention.

Figure 17A:
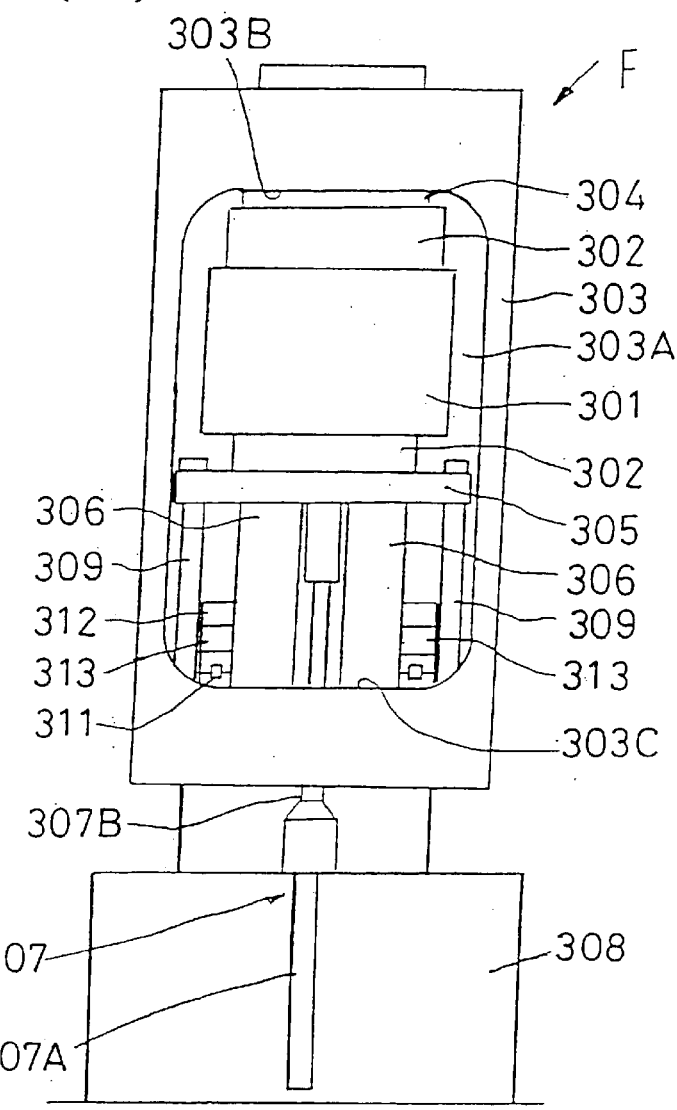
FIG. 17(a) is a front view (elevation) of a pressure processing device schematic plan view.
Figure 17B:
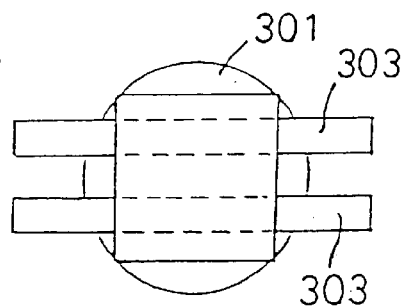
FIG. 17(b) is a schematic plan view.
Figure 18:
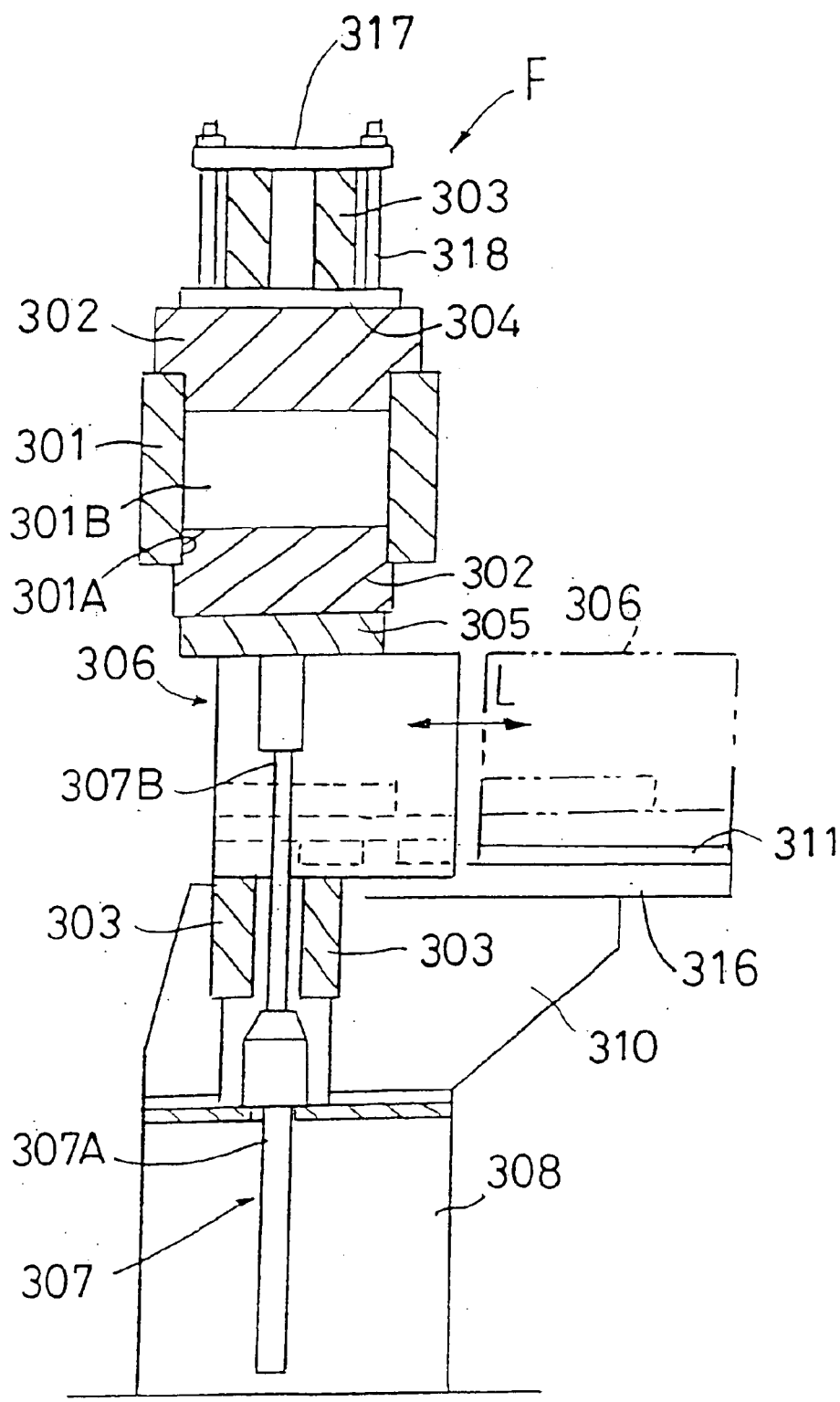
FIG. 18 is a longitudinal sectional side view of the device of FIG. 17.

FIGS. 17(a) and (b) are a front view and a plan view, respectively, during the pressure processing, and FIG. 18 is likewise a longitudinal sectional side view. A pressure processing device F shown in FIGS. 17 and 18 comprises at least, a processing vessel 301 having an opening part 301A for taking in- and out an object to be processed (a specimen), a lid 302 for closing and releasing the opening part 301A of the processing vessel 301, and a press frame 303 formed from, for example, a steel plate having a central space 303A therein, wherein upper and lower ends on the processing vessel 301 side are detachably engaged with upper and lower bearing parts 303B, 303C in the central space 303A, and during the pressure processing, the axial force exerting in an axial direction of the vessel is received by the press frame 303.

More specifically, the processing vessel 301 is a cylindrical body having opening parts 301A at upper and lower parts, and lids (upper and lower lids) 302 are inserted airtightly into the upper and lower opening parts 301A through a seal material not shown to define a processing chamber 301B within the processing vessel 301.

The central space 303A of the press frame 303 is formed into a longitudinal square, and in the upper bearing part 303B, a flat plate-like upper pressure receiving plate 304 is disposed relative to the upper end of the lid (upper lid) 302, whereas in the lower bearing part 303C, a top plate 305 and a pressure receiver 306 are disposed relative to the lower end of the lid (lower lid) 302.

That is, with respect to the lower lid 303, the pressure receiver 306 for receiving the axial force by the press frame 303 between opposed parts of the lid side and the lower bearing part 303C of the press frame 303 is provided horizontally movably, and a lid elevating means 307 is provided which, in the state that the pressure receiver 306 is parted from the opposed parts (see FIGS. 18 and 19), moves up and down the lid 302 in the axial direction of the vessel to close and release the opening part 301A.

The lid elevating means 307 is positioned on the shaft center of the vessel, and is formed, for example, from an expandable fluid cylinder 307A and a piston rod 307B, the rod end being joined to the top plate 305, the press frame 303 and the pressure receiver 306 being provided in pair to left and right sides of the shaft center of the vessel.

The top plate 305 is guided movably up and down along left and right guide shafts 309 stood upright on a fixed frame (a support frame) 308, the press frame 303 being secured to the support frame 308 through a rail frame 310, the pressure receiver 306 being supported capable of being moved laterally on a rail 311 extending on the horizontal surface provided on the rail frame 310 side.

Figure 20:
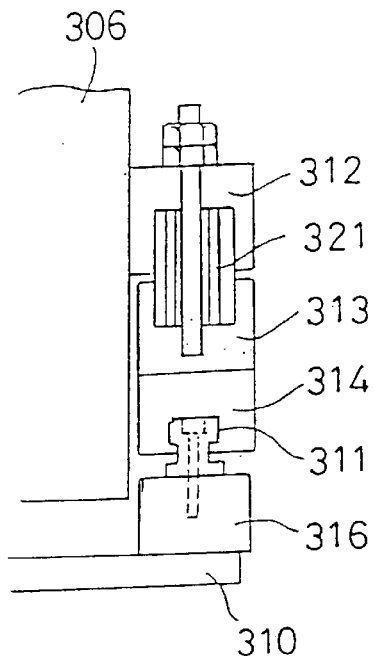
FIG. 20 is a detailed front view showing a part of a horizontal-moving portion of a pressure receiver (a spacer).
Figure 21:
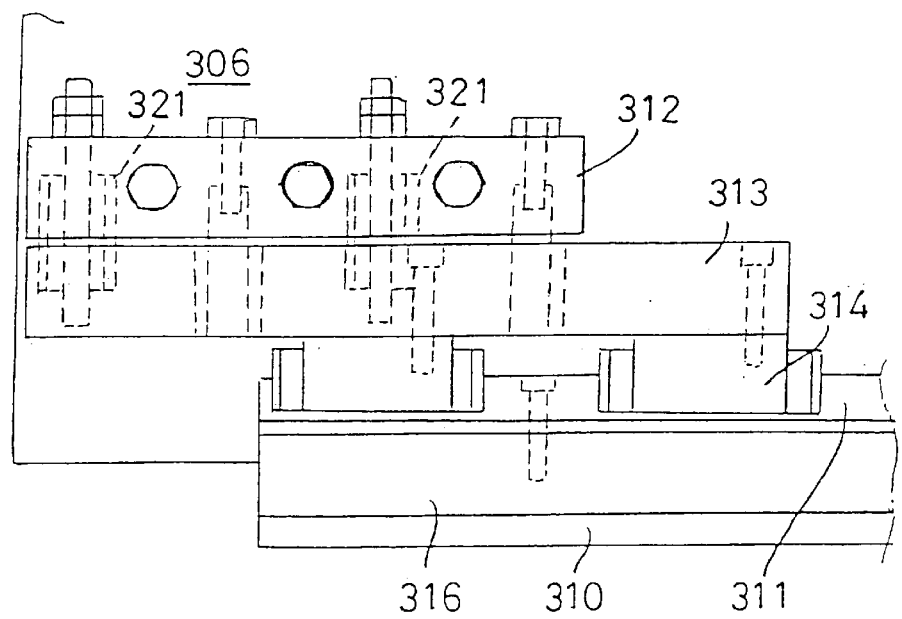
FIG. 21 is a detailed side view showing a part of a horizontal-moving portion of a pressure receiver (a spacer).

The detailed construction of the side of the pressure receiver (spacer) 306 is shown in FIGS. 20 and 21.

A connecting member 312 is provided on the side of the spacer 302, the connecting member 312 being fixed in a horizontal direction relative to a guide fixing member 313. The connecting member 312 is connected to the guide fixing member 313 and a linear bush 321, and can be moved in a vertical direction.

A guide 314 is fixed below the guide fixing member 313. For the guide 314, a direct operated system (the goods name: "LM guide") which is a commercially available industrial article is used. The guide 314 can be moved laterally on the rail 311 horizontally, the rail 311 being secured to and placed on the rail base 316 and the rail frame 310.

The press frame 303 is secured to and placed on the frame 308 through the rail frame 310, and two (paired) press frames 303 are connected and secured by the frame connecting plate 317 at the upper part.

The upper lid 302 is secured to a frame connecting plate 317 by means of a hanging bolt 318, and the vessel cylinder is secured to the upper lid 302 by means of a bolt (not shown).

An elevating shaft (a piston rod) 307B can be moved vertically by means of an elevating jack (a cylinder) 307A secured to the frame 308, and causes the lower lid 302 to move up and down through a lower pressure receiving plate (a top plate) 306.

The procedure for taking in- and out an object to be processed into the vessel will be described hereinafter.

Figure 19:
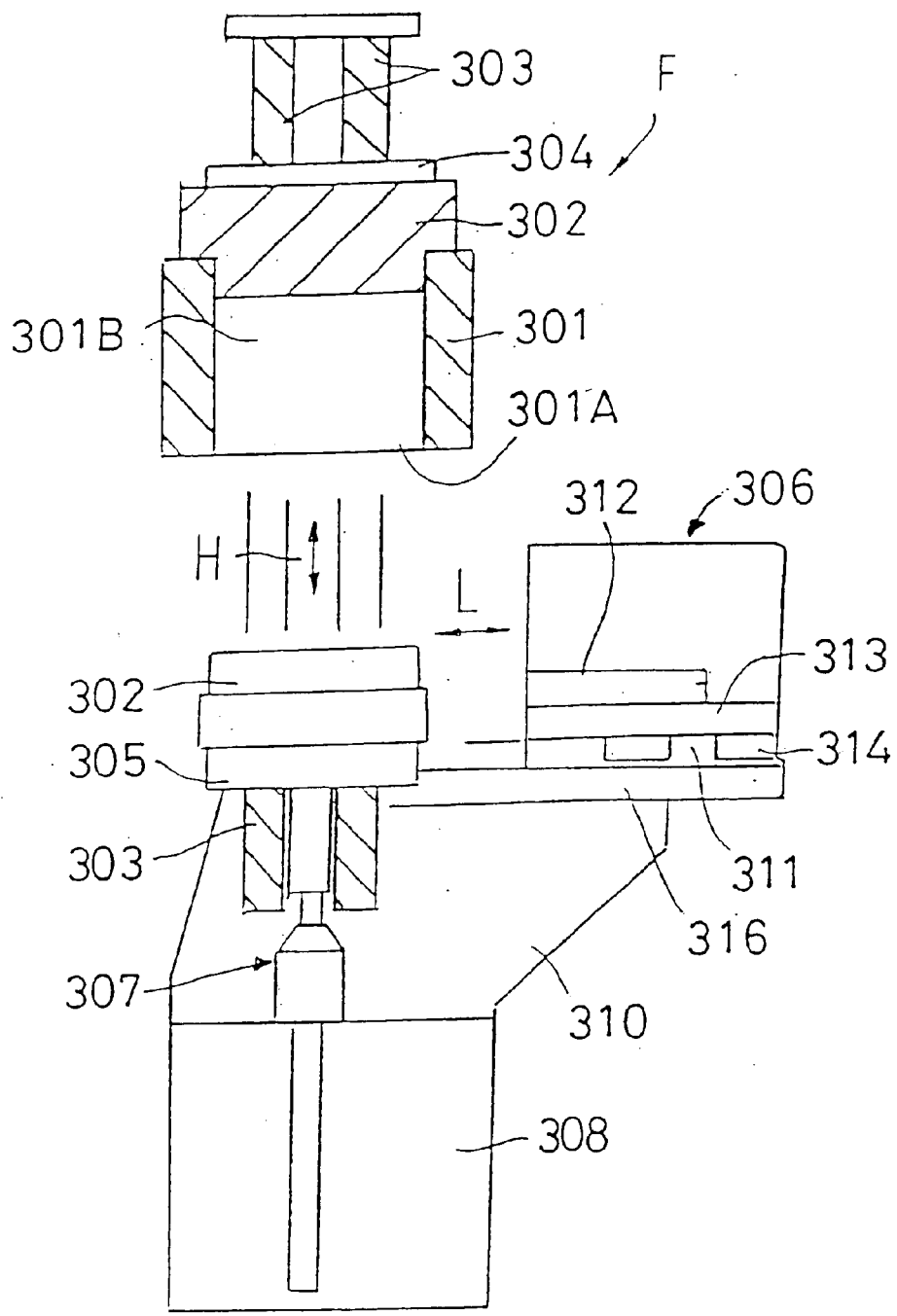
FIG. 19 is a longitudinal sectional side view showing the take-out and take-in in the device of FIG. 17.

In the state that the elevating shaft 307B is raised, the spacer (pressure receiver) 306 is moved to a turnout position (an imaginary position in FIG. 18) in a horizontal direction (see arrow L in FIGS. 18 and 19). That is, the pressure receiver 306 is placed in a state separated from the opposed parts. Then, the elevating shaft 307B is moved down (see arrow H in FIG. 19) by means of the elevating jack 307A, and the lower lid 302 and the lower pressure receiving plate 305 are also moved down simultaneously (see FIG. 19).

An object to be processed is set to the lower lid 302, and the elevating shaft is moved up to mount the lower lid 302 in the opening part 302A of the vessel 302, in which state, a high pressure gas is introduced into the pressure vessel.

According to the present embodiment, the lower lid (lid) can be mounted and removed without causing the press frame to turn or move laterally, whereby a specimen can be taken in and out by a simple method, the closing properties are positive, and the space for installation can be also made compact.

FIGS. 22 to 25 show a pressure processing device 401 according to another embodiment. The pressure processing device 401 is provided to wash a plurality of objects to be processed (semiconductor wafers) W by a supercritical fluid, and has a washing vessel (a pressure vessel) 402 interior of which serves as a processing space for washing. The washing vessel 402 comprises a vessel cylinder 403, an upper lid 404 for closing the upper part of the vessel cylinder 403, and a lower lid 405 for closing the lower part of the vessel cylinder 403.

The washing vessel 402 is maintained at a high pressure atmosphere for the supercritical processing. In order to hold the internal pressure of the vessel, the upper lid 404 and the lower lid 405 are used in the state that they are secured to the vessel cylinder 403. It is noted that in order to seal the internal pressure of the vessel, the upper lid 404 and the lower lid 405 are respectively provided with a seal member 406.

Where the semiconductor wafer is stored or removed, either the lower lid 405 is moved up and down vertically by the elevating means (not shown) in the state that the upper lid 404 and an integral cylinder of the vessel cylinder 403 are fixed, or the upper lid 404 and an integral cylinder of the vessel cylinder 403 are moved up and down vertically by the elevating means (not shown) in the state that the lower lid 405 is fixed.

A diaphragm chamber 407 is mounted on the upper surface of the lower lid 405. The diaphragm chamber 407 is cylindrical, and an opening into which a washing fluid flows is provided in an upper ceiling part thereof.

The diaphragm chamber 407 is internally provided with a cylindrical housing vessel 408, which is mounted on the upper surface of he lower lie 405 similarly to the diaphragm chamber 407. The housing vessel is formed in the form of an inverted-cup, and is internally provided with a plurality of projections 409 projected inward heightwise, the plurality of projections 409 being also provided in the peripheral direction at the same height position, and a wafer W is placed on the projection at each height position, whereby a plurality of wafers W can be set one by one to the housing vessel in the vertical direction.

Figure 22:
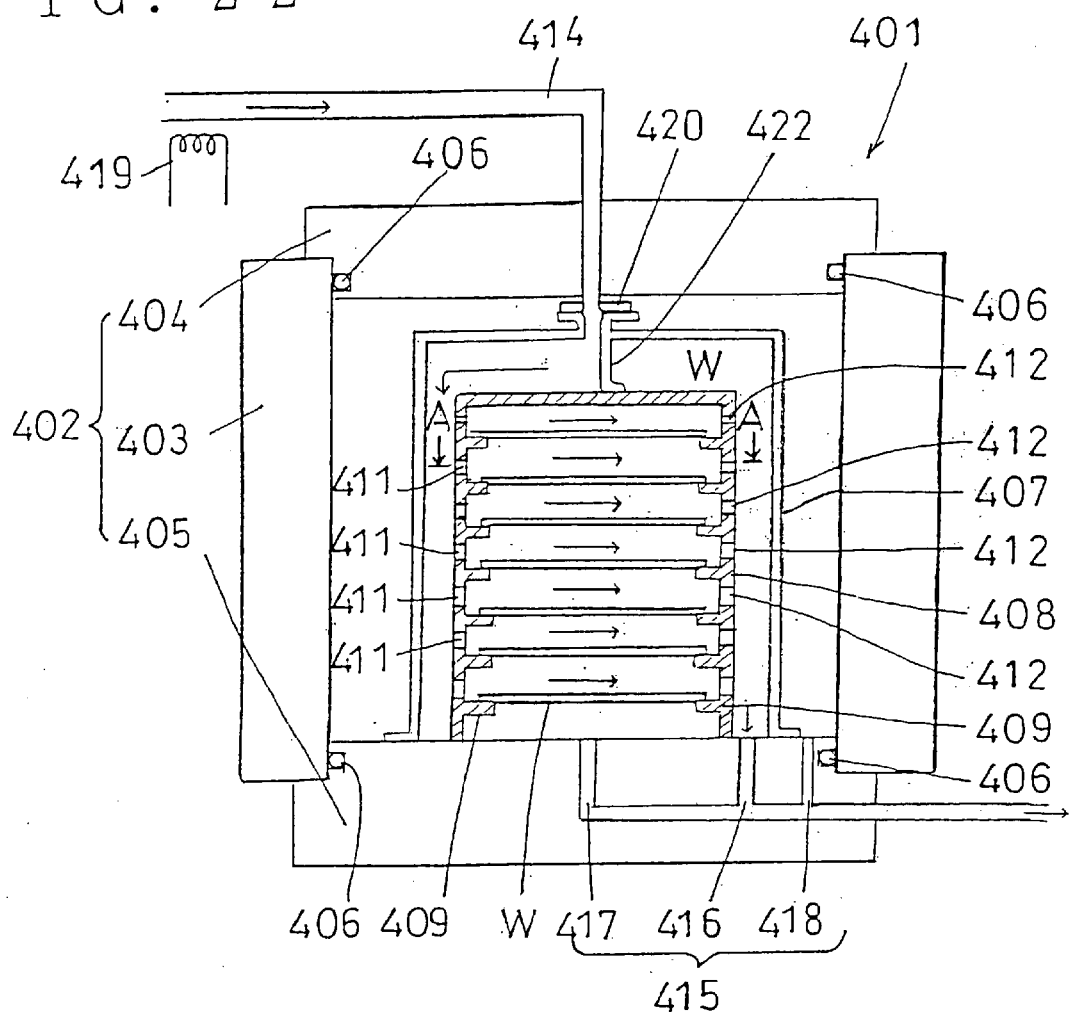
FIG. 22 is a sectional constructional view of a pressure processing device (a washing device) according to another embodiment.
Figure 24:
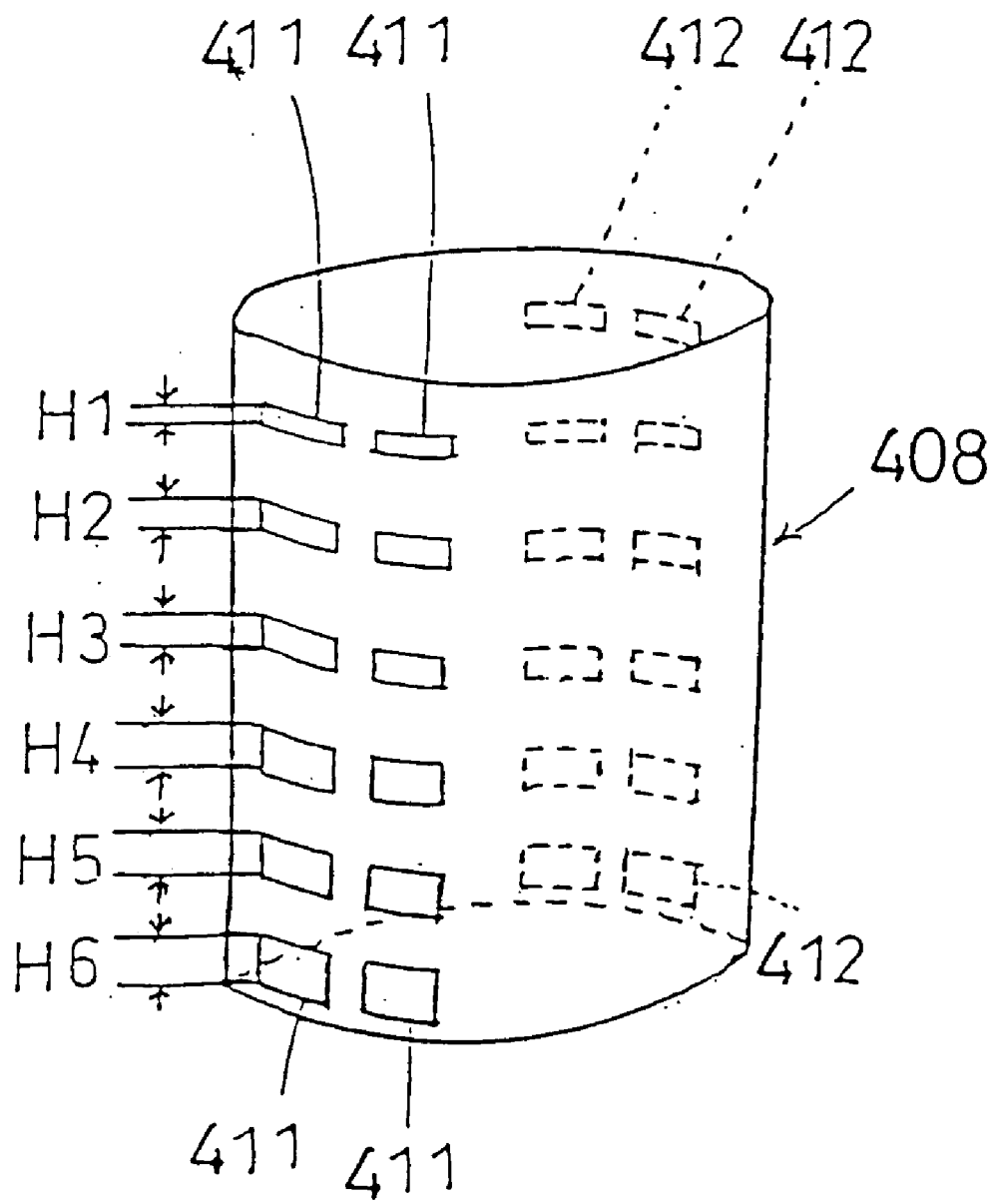
FIG. 24 is an external view of a housing vessel of the apparatus shown in FIG. 22.

As shown in FIG. 22 also, on the side of the housing vessel 408, there are provided in plural number inlets 411 into which a washing fluid flows, and outlets 412 from which a washing fluid is discharged, in an opposed relation, and the fluid flows on the respective wafer surface placed within the housing vessel 408. Further, as shown in FIG. 24, opening areas of the inlet 411 and the outlet 412 are changed to the vertical direction (axial direction of the housing vessel) which is the placing direction of the wafer W in the housing vessel 408 so that the quantity of fluid flowing on the respective wafer W surface is even.

Here, the heights of opening parts of the inlets 411 and the outlets 412 are different, such as H1, H2, H3, H4, H5 and H6 from the top, and the height of the opening of the inlet 411 provided at the lower part is designed to be increased.

The washing fluid is introduced into the washing vessel 402 by a fluid introducing path 414, and is discharged outside the washing vessel 402 by a fluid discharge path 415. A heater 419 is provided halfway of the fluid introducing path 414 to heat the fluid to a supercritical temperature or more. The fluid introducing path 414 is mounted on the upper lid 404, and the fluid flows in from the top of the washing vessel 402 passing through the upper lid 404. Further, the fluid discharge path 415 is mounted on the lower lid 405, and the fluid is discharged from the bottom of the washing vessel 402 passing through the lower lid 405.

The introducing path 414 is connected to the upper opening of the diaphragm chamber 407 through a flange 420 within the washing vessel 402 so that the fluid flows into the diaphragm chamber. In order to prevent the diaphragm chamber 407 from being damaged due to a pressure difference between inside and outside of the diaphragm chamber 407, the flange 420 is not placed in airtight relative to the upper opening of the chamber 407, but the fluid flows outside the flange 420 to some extent. That is, the greater part of the fluid flown into the washing vessel 402 flows into the diaphragm chamber 407, and a part of the fluid flows outside the diaphragm chamber 407.

A partitioning plate 422 is provided between the upper inner surface of the diaphragm chamber 407 and the upper surface of the housing vessel 408 so that the fluid flown into the diaphragm chamber 407 flows from the inlet 411 in the side of the housing vessel 408 to the outlet 412 in one direction. The partitioning plate 422 partitions a space between the diaphragm chamber 407 and the housing vessel 408 into a first guide passage communicated with the introducing path 414 to the inlet 411, and a second guide passage from the outlet 412 to the discharge path 415.

That is, the partitioning plate 422 serves also as a guide part for exclusively guiding the fluid flown into the housing vessel 408 toward the inlet 411. The diaphragm chamber 407 is internally formed, by the partitioning plate 422, with a unidirectional flowing channel in which the fluid flows into the housing vessel 408 from each inlet 411 passing through the first guide passage from the upper opening of the chamber 407 to wash the wafer W, and after that, is discharged outside the housing vessel 48 from each outlet 412 and is discharged outside the washing vessel 402.

Since the fluid flows in one direction as described above, the fluid contaminated with fine stains is prevented from reflowing. The partitioning plate 422 is not completely partition between the first and second guide passages but will suffice if the greater part of fluids flown into the chamber 407 can be guided on the first guide passage, and a small part thereof may flows toward the second guide passage.

The fluids reached the inlets 411 from the first guide passage enter the housing vessel 408 from the inlets 411. At this time, since the flow rate within the chamber 407 is large at the upper part near the fluid introducing path 414, the fluid easily enter the housing vessel 408, and since the flow rate is small at the lower part away from the fluid introducing path 414, the fluid is hard to enter the housing vessel 408.

The inlet 411 and the outlet 412 of the housing vessel 408 are high in the height of the opening at the lower part, as mentioned above, accordingly, the opening area is large, according to a flow-rate difference within the chamber as described above. By differentiating the opening area as described, the fluid quantity within the housing vessel 408 is substantially even in the vertical direction, and a plurality of semiconductor wafers W placed in the vertical direction are washed evenly.

The inlets 411 and the outlets 412 are respectively provided above the projections so that the fluid flows on the surfaces of the wafers W placed on the projections 409.

The lower lid 405 is provided with a fluid main discharge path 416 in communication with the second guide passage, a first fluid sub-discharge path 417 in communication with the inside of the housing vessel 408, and a second fluid sub-discharge path 418 in communication with the outside of the chamber 407.

The first fluid sub-discharge path 417 causes to exhaust directly from the bottom of the housing vessel 408 to prevent fine stains from staying in the housing vessel 408. With the arrangement wherein the fluid flows also externally of the chamber 407, the second fluid sub-discharge path can discharge the fluid from the outside of the chamber 407.

Figure 23:
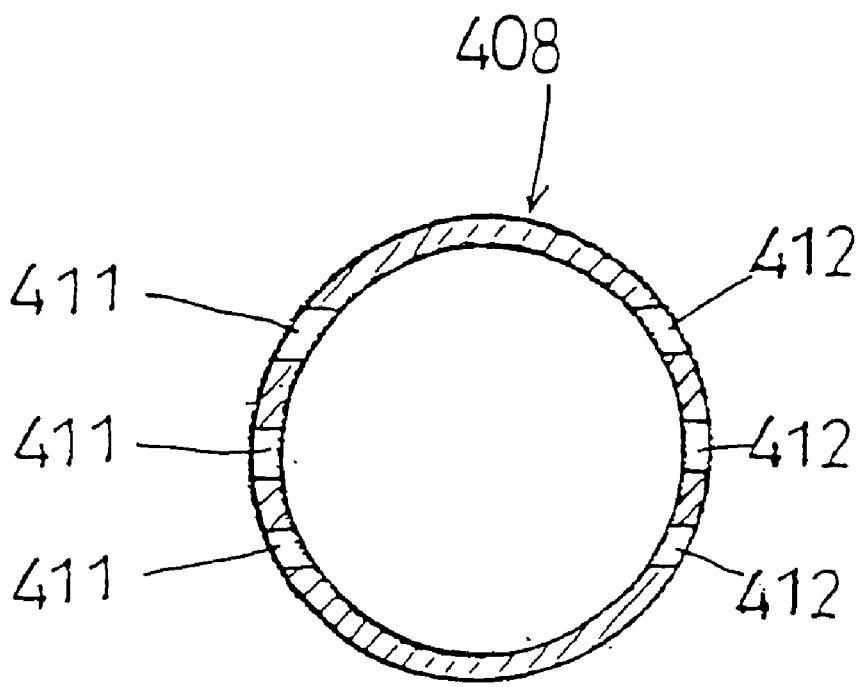
FIG. 23 is a sectional view taken on line A—A of FIG. 22.
Figure 25:
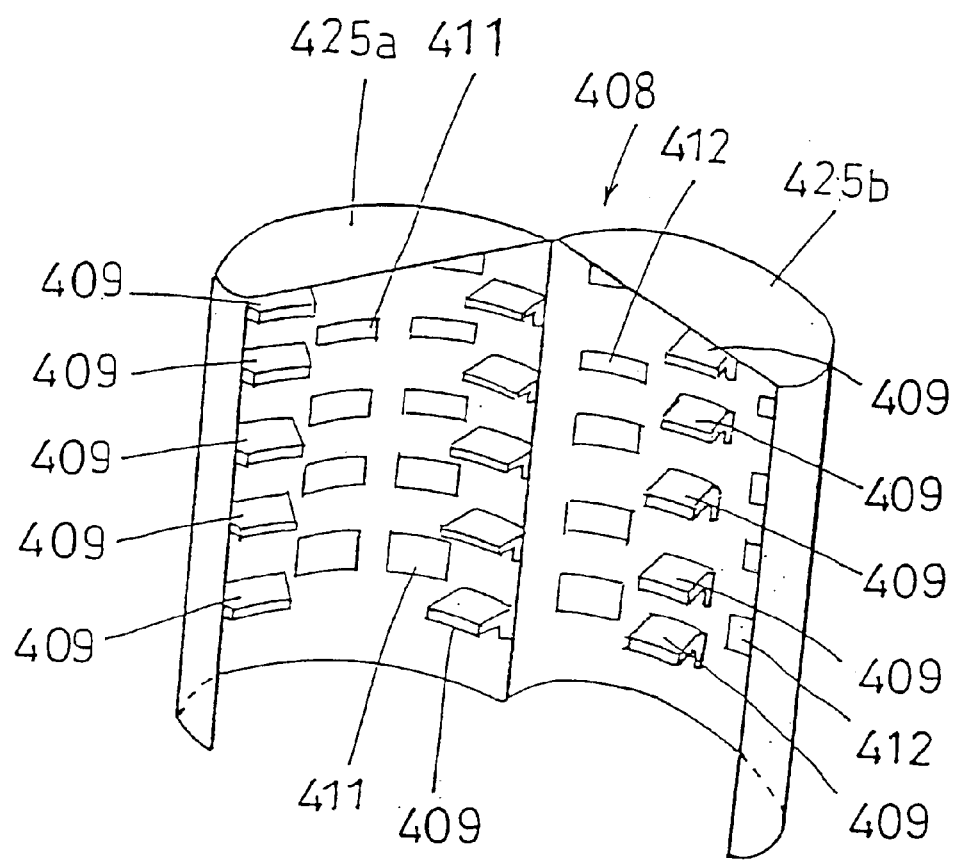
FIG. 25 is an external view showing the state that the housing vessel is opened.

As shown in FIG. 25, the housing vessel 408 comprises two divided members 425a and 425b obtained by dividing the cylinder in a vertical direction (placing direction of wafers W), the divided members 425 being joined by a hinge not shown, and the housing vessel 408 can be placed by the hinge in an open state as shown in FIG. 25 and in a closed state as shown in FIGS. 22 to 24.

The taking in- and out the wafer W with respect to the housing vessel 408 may be carried out in an open state as in FIG. 25.

As described above, according to the pressure processing device 401 in accordance with the above-described embodiment, a plurality of objects to be washed can be processed simultaneously to improve the productivity.

The present invention is not limited to the above-described embodiment. For example, the inlets 411 and the outlets 412 are not to differentiate the opening area but to differentiate the number of openings. That is, in the above-described embodiment, at the upper part of the housing vessel 408, the number of openings can be reduced, and at the lower part thereof, the number of openings can be increased.

Further, while in the above-described embodiment, the washing fluid has been supplied from the top of the washing vessel 402, the fluid may be supplied from the bottom of the washing vessel 402. In this case, in the inlets 411 and the outlets 412, an opening area at the lower part of the housing vessel 408 may be made small, and an opening area at the upper part of the housing vessel 408 may be made large. Further, the position at which the fluid flows into the washing vessel 402 may be other positions and an opening area or the like may be made small near the flowing position.

Further, the placing direction of the semiconductor wafer W is not particularly limited, but for example, the wafers W may be placed in a lateral direction other than the vertical direction.

Further, while in the above-described embodiment, the opening area is differentiated in consideration of the far and near particularly as viewed from the position at which the fluid flows into the washing vessel 402, a flow-rate difference of the fluid sometimes occurs for the reason separately from the far and near from the flowing position depending on the shape of the washing vessel 402 or the like, and also in such a case as described, an opening area of the inlet and the outlet can be differentiated so that the quantity of fluid flowing on the surface of the wafers W is substantially even according to the flow-rate difference.

For the objects to be washed by the present washing device 401, not only a semiconductor wafer but also a micromachine or the like may be employed.

Further, while in the above-described embodiment, the housing vessel 408 is constituted by joining two divided members 425a and 425b by the hinge, it is noted that they are not joined by the hinge but the divided members 425a and 425b are completely divided in advance, and they may be joined by a separate fixing means. Further, the number of the divided members is not limited to two, but three or more may be used.

The pressure processing machine according to the present invention can be utilized for the hot isotropic press processing, the high pressure gas oxidizing (or nitriding) processing, the supercritical gas or liquefied gas extraction processing and so on.

What is claimed is:

1. A pressure processing device comprising:
   a pressure vessel comprising a vessel body and an opening and closing member for closing an opening formed in said vessel body, and
   a seal member provided on one of a joining surface with which said vessel body and said opening and closing member come in contact, and a non-sliding joining surface which is not slidably moved when the opening and closing member is moved to be opened and closed,
   a diaphragm provided in the pressure vessel so as to form an airtight space that is separate from a processing chamber of the pressure vessel, and
   a unit adapted to mount an object to be processed, the unit being provided within said pressure vessel and outside said airtight space.

2. The pressure processing device according to claim 1, further comprising:
   a second diaphragm formed of a heat insulating material provided between the object to be processed and the pressure vessel, and
   a filter for removing particles installed in an aperture on the second diaphragm, said filter removing particles from fluid flowing through said aperture.

3. The pressure processing device according to claim 2, wherein said diaphragm is formed of materials selected the group consisting of quartz, ceramics, metals having a low heat conductivity, and a combination of said materials.

4. The pressure processing device according to claim 2, wherein the filter is made of metal.

5. A pressure processing device for processing an object to be processed by coming into contact with a supercritical fluid, a sub-critical fluid or a liquefied gas, comprising,
   a pressure vessel comprising a cylinder, one end of which is closed, and a lid for closing an opening at the other end of the cylinder,
   a pressing means provided to press the lid in an axial direction of said cylinder with respect to said cylinder,
   a seal member provided between the open end of the cylinder and the opposed end of the lid opposite to the opened end of the cylinder,
   a diaphragm provided in the pressure vessel so as to form an airtight space that is separate from a processing chamber of the pressure vessel, and
   a unit adapted to mount an object to be processed, the unit being provided within said pressure vessel and outside said airtight space.

6. The processing device according to claim 5, further comprising a heater provided in the airtight space formed by said diaphragm.

7. The processing device according to claim 5, further comprising,
   a fluid introducing passage and a fluid discharge passage separately provided so as to communicate with the inside and the outside, respectively, of said diaphragm.

8. The processing device according to claim 5, further comprising,
   a fluid introducing passage and a fluid discharge passage separately provided to the pressure vessel, and
   a filter for removing particles provided in said fluid introducing passage.

9. The processing device according to claim 5, further comprising:
   a heater provided in the airtight space formed by said diaphragm, a heat insulating layer provided in the pressure vessel so that the inside and the outside of said heat insulating layer are separated airtightly, a communicating passage for communicating the inside and the outside of said heat insulating layer, and a filter for removing particles provided in said communicating passage.

10. The pressure processing device according to claim 5, further comprising:

a second diaphragm formed of a heat insulating material provided between the object to be processed and the pressure vessel, and a filter for removing particles installed in an aperture on the second diaphragm, said filter removing particles from fluid flowing through said aperture.

11. The pressure processing device according to claim 10, wherein the filter is made of metal.

12. A pressure processing device comprising:

a pressure vessel comprising a vessel body containing a processing space, and an opening and closing member for closing an opening formed in said vessel body, a seal member mounted on a joining interface between said vessel body and said opening and closing member, and a plate having a labyrinth construction for trapping particles by parts on a surface thereof, the plate provided in the processing space at a position away from said seal member.

13. The pressure processing device according to claim 12, further comprising, a fluid flowing passage for discharging a fluid into the processing space through said opening and closing member and on a back side of the plate having the labyrinth construction.

14. A pressure processing device in which an object may be washed, comprising:

a washing vessel, a cylindrical housing vessel for housing a plurality of objects to be washed, provided within said washing vessel, a plurality of inlets provided on said cylindrical housing vessel for introducing the washing fluid into the cylindrical housing vessel, and a plurality of outlets provided on said cylindrical housing vessel for discharging the washing fluid outside the cylindrical housing vessel, wherein the openings of the respective plurality of inlets and plurality of outlets are formed and positioned so that the quantity of the washing fluid flowing on each object to be washed is substantially even.

15. A pressure processing device in which an object may be washed, comprising:

a washing vessel, a housing vessel for housing a plurality of objects to be washed, provided within said washing vessel, an inlet provided on said housing vessel for introducing the washing fluid into the housing vessel, and an outlet provided on said housing vessel for discharging the washing fluid outside the housing vessel, wherein the openings of the respective inlet an d outlet are formed and positioned so that the quantity of the washing fluid flowing on each object to be washed is substantially even, wherein a plurality of corresponding inlets and outlets are provided on said housing, and wherein the inlet and the outlet sectional areas of said corresponding inlets and outlets become progressively larger at locations farther away from a position at which the washing fluid flows into the washing vessel.

16. The pressure processing device according to claim 14, wherein said cylindrical housing vessel comprises a plurality of members separating the objects to be washed.

17. The pressure processing device according to claim 14, further comprising a diaphragm chamber provided between said washing vessel and said cylindrical housing vessel.

18. A pressure processing device, in which an object may be washed, comprising:

a washing vessel being provided therein with a housing vessel for housing a plurality of objects to be washed, and said housing vessel being provided with a plurality of inlets for introducing the washing fluid into the housing vessel, and a plurality of outlets for discharging the washing fluid outside the housing vessel, wherein the washing vessel is internally formed with a first guide passage for guiding the washing fluid to the plurality of inlets, and a second guide passage for guiding the washing fluid from the plurality of outlets.

19. The pressure processing device according to claim 18, wherein a diaphragm chamber is provided between said washing vessel and said housing vessel, and said diaphragm chamber is internally partitioned into a space serving as said first guide passage, and a space serving as said second guide passage.

* * * * *